(12) United States Patent
Kang

(10) Patent No.: US 11,798,814 B2
(45) Date of Patent: Oct. 24, 2023

(54) SEMICONDUCTOR PACKAGE, ELECTRONIC APPARATUS AND METHOD OF MANUFACTURING THE SEMICONDUCTOR PACKAGE

(71) Applicant: SAMSUNG ELECTRONICS CO., LTD., Suwon-si (KR)

(72) Inventor: Junghoon Kang, Anyang-Si (KR)

(73) Assignee: Samsung Electronics Co., Ltd.

( * ) Notice: Subject to any disclaimer, the term of this patent is extended or adjusted under 35 U.S.C. 154(b) by 0 days.

(21) Appl. No.: 17/827,966

(22) Filed: May 30, 2022

(65) Prior Publication Data

US 2022/0293432 A1    Sep. 15, 2022

Related U.S. Application Data

(63) Continuation of application No. 16/925,982, filed on Jul. 10, 2020, now Pat. No. 11,348,807.

(30) Foreign Application Priority Data

Jan. 2, 2020 (KR) .................. 10-2020-0000463

(51) Int. Cl.
| | |
|---|---|
| H01L 21/48 | (2006.01) |
| H01L 23/538 | (2006.01) |
| H01L 25/18 | (2023.01) |
| H01L 25/00 | (2006.01) |
| H01L 21/683 | (2006.01) |
| H01L 23/498 | (2006.01) |

(52) U.S. Cl.
CPC ...... *H01L 21/4857* (2013.01); *H01L 21/4853* (2013.01); *H01L 21/6835* (2013.01); *H01L 23/5383* (2013.01); *H01L 25/18* (2013.01); *H01L 25/50* (2013.01); *H01L 23/49811* (2013.01); *H01L 2221/68381* (2013.01)

(58) Field of Classification Search
CPC ..... H01L 21/4857; H01L 25/18; H01L 25/50; H01L 21/4853; H01L 23/5383; H01L 21/6835; H01L 23/49811; H01L 2221/68381
USPC .......................................................... 257/773
See application file for complete search history.

(56) References Cited

U.S. PATENT DOCUMENTS

| | | | |
|---|---|---|---|
| 8,642,385 B2 | 2/2014 | Xue et al. | |
| 8,993,380 B2* | 3/2015 | Hou | H01L 23/3135 |
| | | | 438/112 |
| 9,048,222 B2* | 6/2015 | Hung | H01L 23/5384 |
| 9,214,353 B2* | 12/2015 | Yonehara | B23K 26/53 |
| 9,263,255 B2* | 2/2016 | Heo | H01L 33/0075 |
| 9,589,903 B2 | 3/2017 | Chen et al. | |

(Continued)

*Primary Examiner* — Vu A Vu
(74) *Attorney, Agent, or Firm* — Fish & Richardson P.C.

(57) ABSTRACT

A semiconductor package includes an interposer having a separation layer on a rear surface of which a plurality of first recesses is arranged. A plurality of wiring structures is stacked on the separation layer alternately with a plurality of insulation interlayers. A plurality of semiconductor devices is arranged, side by side, on the interposer side and connected to a plurality of the wiring structures. A plurality of contact terminals on the rear surface of the separation layer is connected to the plurality of the wiring structures through the separation layer. A flatness deterioration of the interposer is minimized and the contact surface between the interposer and under fill resin is enlarged.

10 Claims, 24 Drawing Sheets

(56) References Cited

U.S. PATENT DOCUMENTS

| | | |
|---|---|---|
| 10,115,613 B2 | 10/2018 | Chang et al. |
| 10,134,708 B2 * | 11/2018 | Yu ................... H01L 23/49827 |
| 10,270,018 B2 * | 4/2019 | Jang ..................... H01L 33/60 |
| 10,381,301 B2 | 8/2019 | Shih |
| 10,510,634 B2 * | 12/2019 | Lin ..................... H01L 21/6835 |
| 2017/0338128 A1 * | 11/2017 | Huang ............. H01L 23/49816 |
| 2018/0047651 A1 | 2/2018 | Chen et al. |
| 2019/0096824 A1 | 3/2019 | Hur et al. |
| 2019/0131273 A1 | 5/2019 | Chen et al. |
| 2019/0194453 A1 | 6/2019 | Liu et al. |
| 2019/0333847 A1 | 10/2019 | Watanabe et al. |

* cited by examiner

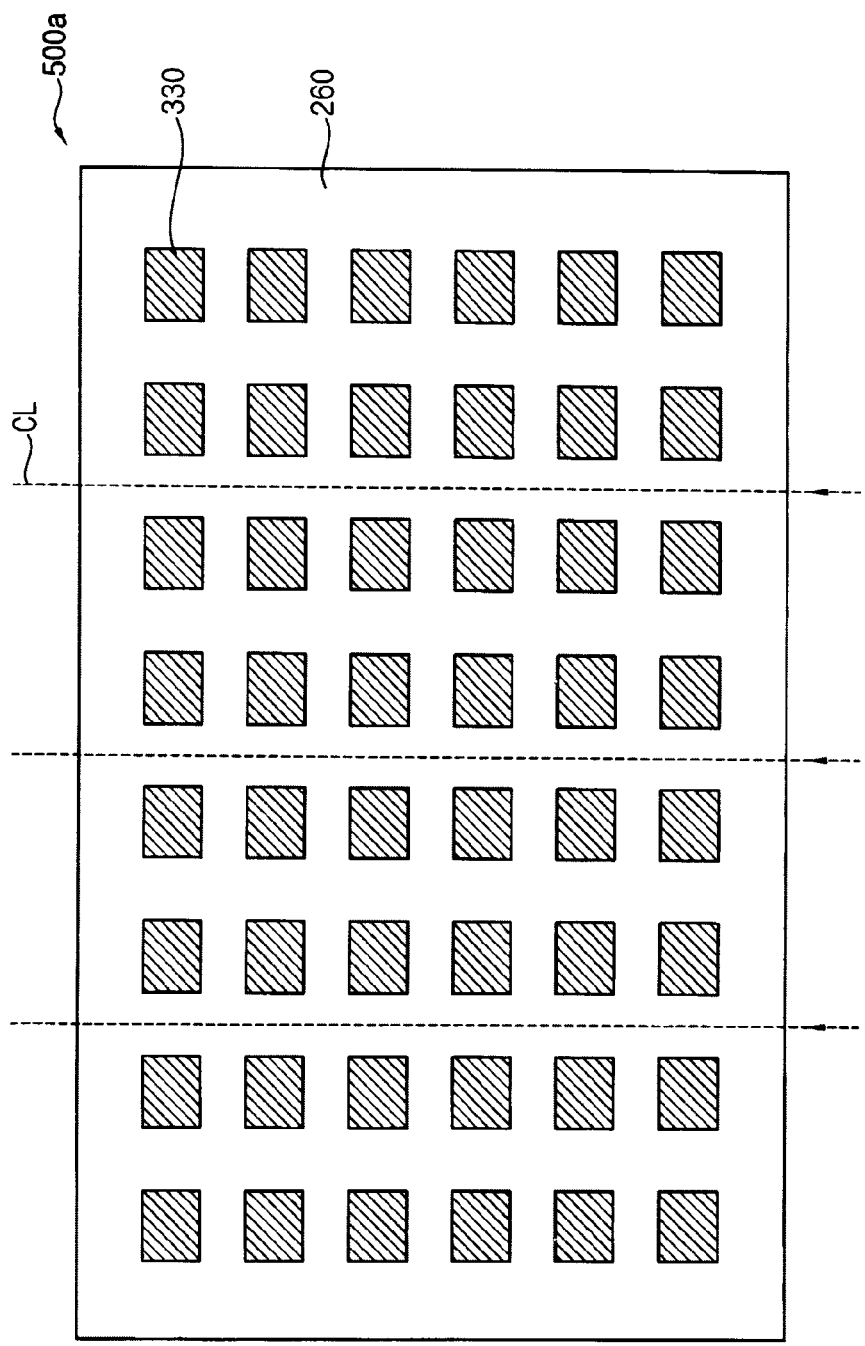

SEMICONDUCTOR PACKAGE, ELECTRONIC APPARATUS AND METHOD OF MANUFACTURING THE SEMICONDUCTOR PACKAGE

CROSS-REFERENCE TO RELATED APPLICATIONS

This is a Continuation of U.S. application Ser. No. 16/925,982, filed Jul. 10, 2020, and a claim of priority under 35 USC § 119 is made to Korean Patent Application No. 10-2020-0000463 filed on Jan. 2, 2020 in the Korean Intellectual Property Office, the contents of which are incorporated by reference herein in their entirety.

BACKGROUND

1. Field

Example embodiments relate to a semiconductor package and an electronic apparatus having the semiconductor package and a method of manufacturing the semiconductor package, and more particularly, to a fan-out semiconductor package having a non-silicon interposer and an electronic apparatus having the semiconductor package and a method of manufacturing the semiconductor package.

2. Description of the Related Art

As the fan-out semiconductor package has widely spread for a small thickness and high signal transfer efficiency, an interposer has also been widely required for connecting contact pads of a die and contact bumps for electrically connecting with an exterior system. Particularly, the high cost silicon interposer tends to be replaced with a low cost non-silicon interposer.

The conventional fan-out package is manufactured by sequential unit steps of forming an interposer having a separation layer and wirings on a carrier, bonding a die onto the interposer and de-bonding the interposer from the carrier by using the separation layer.

In the conventional manufacturing processes of the fan out package, residuals of the separation layer tend to remain on a rear surface of the interposer when the interposer is separated from the carrier by decomposing the separation layer. Thus, the etching for removing the residuals of the separation layer is necessarily required before forming the contact bumps on the rear surface of the interposer. Therefore, the process efficiency for separating the interposer and the carrier is significantly reduced due to the etching process for removing the residuals of the separation layer.

In addition, according to the conventional processes for manufacturing the fan out package, a single interposer may be adhered to a whole surface of a panel type carrier and the adhering structure of the interposer and the carrier is separated into a plurality of trim panels having an interpose piece and a carrier piece adhered to each other by a trim process such as a sawing process. However, when the trim process is applied to the adhering structure, an external force is applied to the separation layer and the separation layer is partially broken and torn from the interposer piece, which is widely known as a plump defect. In such a case, there is known that that the wirings on the interposer are occasionally separated from the separation layer.

The tearing and the plump defect of the separation layer usually cause the shortage of the re-directional wirings and the operation failures of the fan-out package having the interposer.

SUMMARY

Example embodiments of the present disclosure provide a semiconductor package having an interposer on a rear surface of which a plurality of recesses is arranged to thereby improve a combining force between an under-fill resin and the interposer.

Other example embodiments of the present disclosure provide an electronic apparatus including the above semiconductor package.

Still other example embodiments of the present disclosure provide a method of manufacturing the above semiconductor package.

According to exemplary embodiments of the disclosure, there is provided a semiconductor package having an interposer and a plurality of semiconductor devices on the interposer. A plurality of contact terminals and a plurality of first recesses may be arranged on a rear surface of the interposer. A main board may include a plurality of board contact pads on which the semiconductor package may be mounted such that the board contact pads may be connected with the contact terminals. A package under fill resin may fill a gap space between the interposer and the main board such that the under fill resin may be contact the first recesses.

According to other exemplary embodiments of the disclosure, there is provided an electronic apparatus including the semiconductor package. The electronic apparatus may include a semiconductor package having an interposer and a plurality of semiconductor devices on the interposer. A plurality of contact terminals and a plurality of first recesses may be arranged on a rear surface of the interposer. A main board may include a plurality of board contact pads on which the semiconductor package may be mounted such that the board contact pads may be connected with the contact terminals. A package under fill resin may fill a gap space between the interposer and the main board such that the under fill resin may contact the first recesses.

According to exemplary embodiments of the disclosure, there is provided a method of manufacturing the semiconductor package. A preliminary interposer may be formed on a carrier such that the preliminary interposer may include: (1) a separation layer and (2) a plurality of wiring structures and a plurality of insulation interlayers alternately stacked on the separation layer with each other. Then, a plurality of the semiconductor devices may be mounted on the preliminary interposer side by side such that the semiconductor devices may be connected to the wiring structures. A securing mold may be formed on the interposer to secure the semiconductor devices to the preliminary interposer and to cover the semiconductor devices and the interposer. An interposer may be formed by separating the carrier from the separation layer after reforming the separation layer by a light in such a way that a plurality of first recesses may be arranged at a rear surface of the interposer. A plurality of contact terminals may be formed on the separation layer from the first recesses such that the contact terminals may be connected to the wiring structures.

According to example embodiments of the present disclosure, the interposer may include fine-pitched wiring lines and an insulation layer may be used as the separation layer without any additional separation members, so that the interposer may have sufficient flatness at a rear surface thereof despite a trim process. Therefore, contact failures between the semiconductor devices and the contact terminals may be sufficiently minimized or prevented despite the fine-pitched wiring lines, which may sufficiently improve the operation reliability of the electronic apparatuses despite the fine-pitched wiring lines of the interposer.

In addition, the carrier de-bonding process may be conducted by an optical process instead of a mechanical process. The separation layer and/or the extending mold may be partially changed into a soft melting state or a sol state by the light, so that the separation layer and/or the extending mold may be easily separated from the carrier without any plump defects or separation defects in the trim process. Accordingly, the interposer may have a sufficient flatness despite the fine-pitched or the fine-patterned wiring structures, and thus the contact failures between the semiconductor devices and the contact terminals may be sufficiently prevented in the semiconductor package.

Further, since no additional separation member may be required, no additional etching process may be required after the carrier de-bonding process. When the additional separation member may be provided on the carrier, the additional separation member may remain on the rear surface of the interposer and thus additional etching process for removing the residuals of the separation member may be required. However, according to the present example embodiment of the present disclosure, no additional etching process may be required after the carrier de-bonding process since no additional separation member may be required.

In addition, a plurality of recesses may be provided on the rear surfaces of the separation layer and the extending mold. Thus, when the semiconductor package may be mounted on the main board of the electronic apparatus, the contact area may be enlarged between the separation layer and the package under fill resin and between the extending mold and the package under fill resin, to thereby improve the combining force between the semiconductor package and the main board.

BRIEF DESCRIPTION OF THE DRAWINGS

These and other features of the disclosure will become more apparent by describing in detail exemplary embodiments thereof with reference to the accompanying drawings of which:

FIGS. 10A to 10C are cross-sectional views illustrating the processing steps for a method of conducting the trim process to the preliminary interposer shown FIG. 9D;

DETAILED DESCRIPTION OF THE EMBODIMENTS

Figure 1:
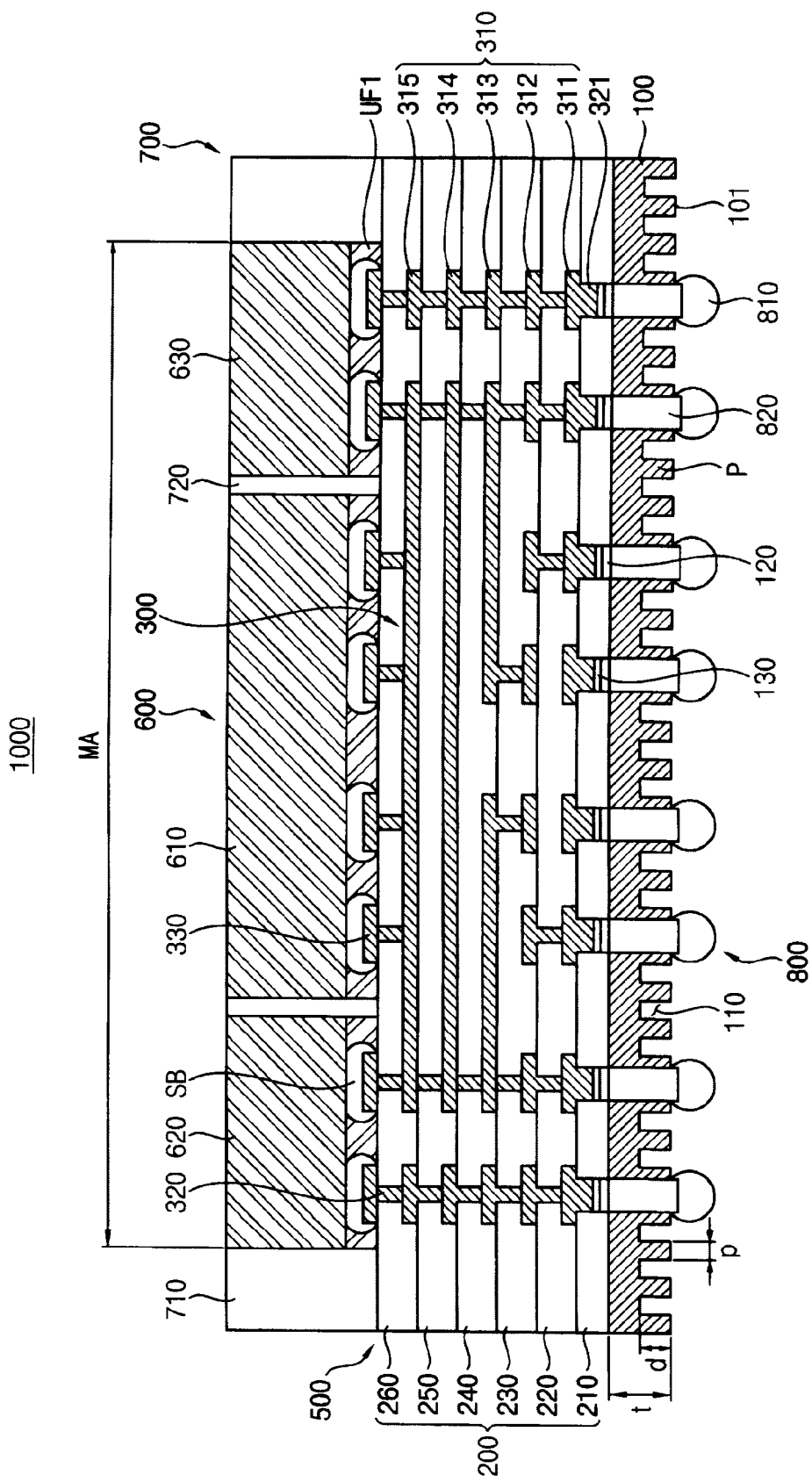
FIG. 1 is a cross-sectional view illustrating a semiconductor package in accordance with an example embodiment of the present disclosure.

Reference will now be made to example embodiments, which are illustrated in the accompanying drawings, wherein like reference numerals may refer to like components throughout.

FIG. 1 is a cross-sectional view illustrating a semiconductor package in accordance with an example embodiment of the present disclosure.

Referring to FIG. 1, a semiconductor package 1000 in accordance with an example embodiment of the present disclosure may include an interposer 500 having a plurality of wiring structures 300 and a separation layer 100, a plurality of semiconductor devices 600 arranged on the interposer 500 side by side, a securing mold 700 securing the semiconductor devices 600 to the interposer 500 and a plurality of contact terminals 800 on a rear surface of the interposer 500. In the present example embodiment, a fan-out package is provided as the semiconductor package 1000 in which the semiconductor devices 600 are connected to the contact terminals 800 via the interposer 500.

For example, the interposer 500 may include a separation layer 100 and a plurality of insulation interlayer layers 200 and a plurality of wiring structures 300 alternately stacked on the separating insulation layer 100.

The separation layer 100 may include insulation materials and function as a passivation layer for protecting the wiring structures 300 from exterior impacts and chemical damages. In addition, the separation layer 100 may be sufficiently adhered to a carrier, which is described in detail hereinafter, and thus the interposer 500 may be sufficiently well separated from the carrier without the plump defect in the trim process. That is, a separation defect at which the interposer 500 and the carrier are insufficiently separated may be prevented or minimized by the separation layer 100 in the trim process.

In the present example embodiment, the separation layer 100 may include photo imageable dielectric (PID) materials that may be partially decomposed by a light. Thus, the interposer 500 and the carrier may be de-bonded by decomposing the separation layer 100. That is, the carrier de-bonding process may be conducted just by a radiation of the light.

Thus, the shape of the separation layer 100 may be varied according to a package process. For example, the separation layer 100 may be shaped into a rectangle in a panel level package (PLP) process and be shaped into a wafer in a wafer level package (WLP) process.

The PID may undergo photochemical reactions with the light at an optical point on which the light is irradiated and the optical point may be changed into a soft melting state or a sol state. For example, the PID material may include polyimide. When a laser may be irradiated onto the polyimide separation layer 100, some elements of the polyimide may be changed into a gas state at the optical point and the gases may be diffused to an outside of the separation layer 100. Thus, the polyimide separation layer 100 may be partially changed into soft meting states at the optical points, and the soft melting points may be arranged on the separation layer 100 corresponding to the optical points.

Particularly, since the soft melting points of the polyimide separation layer 100 may be arranged only at the optical points, the pitch between the neighboring soft melting points may be controlled by the resolution of the irradiated light. In addition, since the separation layer 100 may be decomposed by the light, the separation layer 100 may have a small thickness as much as possible.

In the present example embodiment, the separation layer 100 comprising PID may have a thickness t in a range of about 1 μm to about 100 μm. When the thickness of the separation layer 100 may be smaller than about 1 μm, the separation layer 100 may not be adhered to the carrier and thus the plump defect or the separation defect may occur in the trim process. In contrast, when the thickness of the separation layer 100 may be greater than about 100 μm, the thickness of the interposer 500 may be so great that an overall thickness of the semiconductor package 1000 may be excessively high.

A plurality of first recesses 110 may be arranged on a whole rear surface 101 of the separation layer 100 like a matrix and each of the first recesses 110 may be recessed to a depth d from the rear surface 101 of the separation layer 100. Thus, a plurality of protrusions P may also be arranged on the rear surface 101 of the separation layer 100 corresponding to the first recesses 110.

For example, the first recess 110 may have the depth d less than half the thickness t of the separation layer 100 and the neighboring first recesses 110 may be spaced apart from each other by a pitch p. Since the thickness t of the separation layer 100 may be in a range of about 5 μm to about 100 μm, the depth d of the first recess 110 may be in a range of about 0.5 μm to about 50 μm.

The first recesses 110 may be formed by the optical reformation of the separation layer 100, so that the pitch p between the neighboring first recesses 110 may be controlled by the resolution of the light. As will be described in detail hereafter, the first recess 110 may enlarge the contact area between a gap-fill resin and the interposer 500 when the semiconductor package 1000 may be mounted on a main board of an electronic apparatus. The smaller the pitch p of the first recesses 110, the larger the contact area of the interposer 500 with the gap-fill resin. Thus, the pitch p of the first recesses 110 may be determined in view of the combining force between semiconductor package 1000 and the main board.

While the present example embodiment discloses that the first recess 100 may be shaped into a rectangle, the shape of the first recess 100 may be varied according to the light and beam configurations of the light.

Figure 2A:
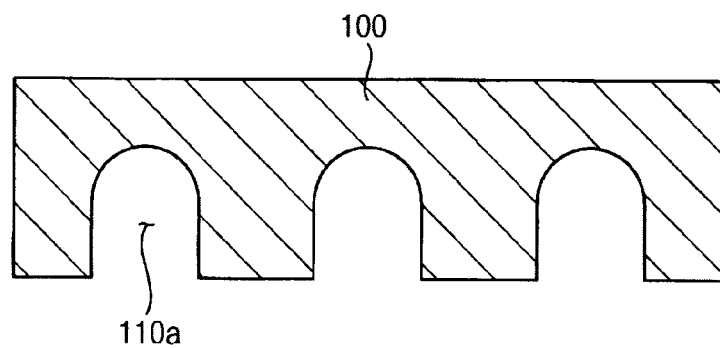
FIGS. 2A to 2C are cross-sectional views illustrating the shape of the first recess of the semiconductor package shown in FIG. 1.
Figure 2B:
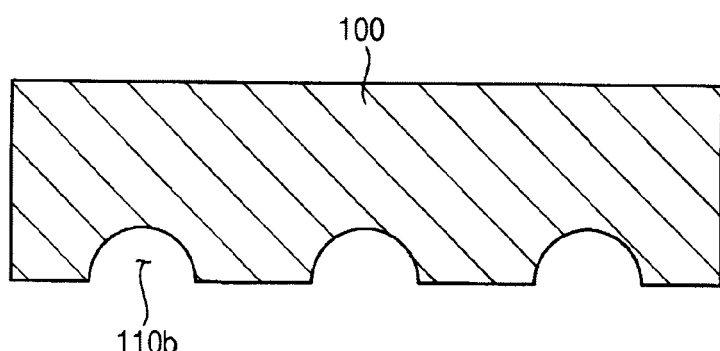
Figure 2C:
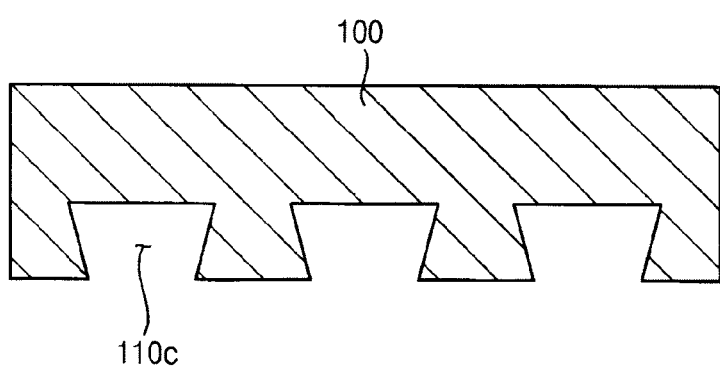

FIGS. 2A to 2C are cross-sectional views illustrating the shape of the first recess of the semiconductor package shown in FIG. 1.

Referring to FIGS. 2A to 2C, the first recess 110 may have various shapes as long as the shape of the first recess may improve the contact area between the gap-fill resin and the interposer 500 and the separation conveniences in the de-bonding process. Particularly, the shape of the first recess 110 may be changed just by changing the irradiation conditions of the light to the separation layer 100 in the de-bonding process.

For example, the first recess 110 may be shaped into a dome recess 110a in which a bottom of the recess may be curved or a semicircular recess 110b. The dome recess 110a may increase the contact surface contacting with the gap-fill resin and the semicircular recess 110b may be uniformly distribute the external force applied to the interposer 500 to thereby stably secure the semiconductor package 1000 to the main board.

Further, the first recess 110 may be shaped into a reverse trapezoid in which a side surface of the first recess 110 may be slanted. The reverse trapezoidal recess 110c may function as a gap-fill wedge between the interposer 500 and the main board, and thus the combining force may be sufficiently improved between the semiconductor package 1000 and the main board.

A plurality of the insulation interlayers 200 may be sequentially stacked on the separation layer 100 and a plurality of the wiring structures 300 may be arranged in the insulation interlayers 200. The wiring structure 300 may include a plurality of wiring lines 310 stacked on the insulation layer 100 alternately with the insulation interlayers 200 and a plurality of connection plugs 320 vertically connecting the connection plugs 320 and penetrating through the insulation interlayers 200.

In the present example embodiment, the insulation interlayers 200 may include first to sixth insulation layers 210 to 260 and the wiring lines 310 may include first to fifth conductive lines 311 to 315. The first to fifth conductive lines 311 to 315 may be interposed between the neighboring insulation layers 210 to 260 and may be vertically interconnected with each other by the connection plugs 320 through the corresponding insulation layers 210 to 260. The number of the insulation interlayers 200 and the wiring lines 310 may be varied according to the configurations of the interposer 500.

A plurality of contact pads 330 may be arranged on a top surface of the sixth insulation layer 260 and the semiconductor devices 600 may be connected to the contact pads 330. In addition, the contact pads 330 may also be connected to the wiring lines 310 via the connection plugs 320, so that the semiconductor devices 600 may be finally connected to the contact terminals 800 via the wiring lines 310 and the connection plugs 320.

Since the semiconductor devices 600 may be connected to the contact terminals 800 via the wiring structures 300, the wiring lines 310 may function as re-directional lines changing a connection path between the semiconductor devices 600 and the contact terminals 800.

For example, the insulation interlayers 200 may include any one of a thermosetting resin, a thermoplastic resin and a mixture resin mixed with inorganic fillers such as an ajinomoto build-up film (ABF). For another example, the insulation interlayers 200 may include the same PID as the separation layer 100. In such a case, the insulation layers 200 and the separation layer 100 may comprise the same materials.

Particularly, the first to fifth insulation layers 210 to 260 may have the same materials or some of the first to fifth insulation layers 210 to 260 may have different materials.

The wiring lines 310 may comprise a low-resistive conductive material such as copper (Cu), aluminum (Al), silver (Ag), tin (Sn), gold (Au), nickel (Ni), lead (Pb), titanium (Ti) and combinations thereof.

The wiring line 310 may include a metal line in view of the characteristics of the interposer 500. For example, the wiring line 310 may include a ground line for transferring ground signals, a data line for transferring data signals and a power line for transferring a driving power. Although not shown, the wiring line 310 may further include a plug pad for the connection plug 320 and a terminal pad for the contact terminals 800.

The connection plug 320 may connect vertically the neighboring wiring lines 310 that may be arranged on other insulation layers, so that the electric path may be completed by the connection plug 320 in the semiconductor package 1000. The connection plug 320 may also comprise a low-resistive conductive material such as copper (Cu), aluminum (Al), silver (Ag), tin (Sn), gold (Au), nickel (Ni), lead (Pb), titanium (Ti) and combinations thereof. In the present example embodiment, the connection plug 320 may be shaped into a pillar. However, the connection plug 320 may be shaped into various shapes as long as the contact resistance may be reduced between the connection plug 320 and the wiring lines 310.

The contact pad 330 may be arranged on the top surface of the sixth insulation layer 260 and may be connected to the fifth conductive line 315 via the connection plug 320. A bonding pad (not shown) of the semiconductor devices 600 may be bonded to the contact pad 330 by using a bonding member such as a solder ball SB. Thus, the semiconductor devices 600 may be connected to the wiring structures 300 via the contact pad 330.

A device gap space between the semiconductor devices 600 and the sixth insulation layer 260 may be filled with a device under fill resin DUF, so that the semiconductor device 600 may be protected from external physical shocks, thermal damages, and cracks. The device under fill resin DUF may comprise an insulation resin such as epoxy resin.

The semiconductor devices 600 may include at least a first IC chip 610 and at least a second IC chip 620 that may be electrically connected to the first IC chip 610 via the interposer 500.

In addition, the semiconductor devices 600 may further include various active devices and passive devices according to the characteristics of the semiconductor package 1000. Particularly, when a system in package (SIS) may be provided as the semiconductor package 1000, various passive devices for driving the SIS may be arranged on the interposer 500.

The semiconductor devices 600 may be arranged on the interposer 500 in a side-by-side structure in place of the package on package (PoP) structure for improving the data transfer efficiency. Since the IC chips have been downsized for the high degree of integration, more IC chips and other active or passive devices may be mounted on the interposer 500. Accordingly, the semiconductor package 1000 may have higher capacity and higher efficiency with smaller thickness.

For example, first to third IC chips 610, 620 and 630 may be arranged on the interposer 500.

The first IC chip 610 may include an application specific integration circuit (ASIC) device and the second and third IC chips 620 and 630 may include a memory device such as a DRAM device and a flash memory device. In contrast, the second IC chip 620 may include at least a memory device and the third IC chip 630 may include at least a logic device.

In addition, the second and third IC chips 620 and 630 may include a single memory device, so that the semiconductor package 1000 may be composed of a single ASIC device and a pair of memory devices.

In a modified example embodiment, the first IC chip 610 may include a graphic process unit (GPU) and the second and third IC chips 620 and 630 may include a high bandwidth memory (HBM) device. Thus, the semiconductor package 1000 may be provided as a graphic card having a GPU and a pair of HBM devices in which a pair of the HBM devices may be interconnected with each other via the interposer 500 and may be connected to the GPU, thereby sufficiently improving the performance of the graphic card.

The semiconductor devices 600 may be secured to the interposer 500 by a securing mold 700. For example, the securing mold 700 may comprise an epoxy molding compound (EMC).

For example, the securing mold 700 may include a package mold 710 covering a peripheral portion of the interposer 500 and securing the semiconductor devices 600 to the interposer 500 and a fence mold 720 interposed between the neighboring semiconductor devices 600 to separate the semiconductor devices.

The package mold 710 may be arranged on a peripheral portion of an upper portion of the semiconductor package 1000 and may define a mounting area MA of the interposer 500 in which the semiconductor devices 600 may be arranged. The side surface of the semiconductor devices 600 and the upper surface of the interposer 500 may be contact with the package mold 710, so that the semiconductor devices 600 may be secured to the interposer 500 by the package mold 710. The fence mold 720 may be arranged in the mounting area MA and may be interposed between the semiconductor devices 600. Thus, the semiconductor devices 600 in the mounting area MA may be electrically insulated from each other by the fence mold 720. Particularly, the fence mold 720 may be in contact with the side surfaces of the neighboring semiconductor devices 600 and the upper surface of the interposer 500 in the mold area MA. Thus, the semiconductor devices 600 may be secured to the interposer 500 in the mounting area MA by the fence mold 720.

While the present example embodiment discloses that the securing mold 700 may be exemplarily coplanar with an upper surface of the semiconductor devices 600, the semiconductor devices 600 could be covered with the securing mold 700.

The contact terminal 800 may be arranged on a rear surface of the interposer 500 and the semiconductor devices 600 may communicate with surroundings via the contact terminal 800.

For example, the contact terminal 800 may include a contact structure 810 on the separating layer 100 and a contact via 820 making contact with the contact structure 810 and connected to the wiring lines 310 through the separation layer 100.

The contact structure 810 may make contact with or be connected with surroundings, so that the semiconductor package 1000 may be connected with surroundings. For example, the semiconductor package 1000 may be mounted on a main board of an exterior electronic system by using the contact structure 810. The contact structure 810 may comprise conductive materials such as solder and may be configured into various shapes such as a land, a ball, and a pin.

The contact structure 810 may include a multilayer structure having a copper pillar and a solder layer or include a single layer structure comprising a mixture of tin (Sn) and silver (Ag) or copper (Cu). Tens or thousands of the contact structures 810 may be arranged on the separating layer 100 according to the number of the bonding pads of the semiconductor devices 600.

Accordingly, the semiconductor package 1000 be provided as a fan-out package in which a plurality of input/output terminals may be provided and a 3-dimensional interconnection may be allowable. Particularly, the fan out package may sufficiently reduce a thickness as compared with that of a ball grid array (BGA) package and a land grid array (LGA) package.

The contact via 820 may penetrate through the separation layer 100 and may make contact with an under bump metal (UBM). For example, a penetration hole may be formed in the separation layer 100 in such a way that the UBM may be exposed through the penetration hole and then the penetration hole may be filled with conductive materials to thereby form a conductive plug making contact with the UBM. Thereafter, a reflow process may be applied to the conductive plug and the contact structure 810 may be formed on the separation layer 100 together with the contact via 820 in the contact hole.

In the present example embodiment, first and second metal patterns 120 and 130 may be further provided between the contact via 820 and the wiring lines 310 for improving the contact reliability between the contact via 820 and the metal wirings 310.

The first metal pattern 120 may include the UBM for improving the contact reliability of the contact via 820 and the operation reliability of the semiconductor package 1000. The first metal pattern 120 may be arranged on an upper surface of the separation layer 100 and may make contact with the contact via 820. The first metal pattern 120 may comprise a low-resistive metal such as nickel (Ni), titanium (Ti) and tantalum (Ta).

The second metal pattern 130 may be arranged on the first metal pattern 120 and may be electrically connected to the first metal pattern 120. The second metal pattern 130 may also comprise a low-resistive metal such as copper (Cu), gold (Au), silver (Ag) and aluminum (Al).

The second metal pattern 130 may function as a seed layer for a lowermost plug 321. For example, the lowermost plug 321 may be grown from the second metal pattern 130 by a plating process using the second metal pattern 130 as a seed layer.

The first insulation layer 210 may be formed on the separation layer 100 in such a configuration that the lowermost plug 321 may be exposed and the first conductive line 311 may be formed on the first insulation layer 210 in such configuration that the first conductive line 311 may make contact with the lowermost plug 321. Then, the second insulation layer 220 may be formed on the second insulation layer 210 in such a way that the first conductive line 311 may be partially exposed in a second hole. Then, a first plug may be formed in the second hole to make contact with the first conductive line 311 and the second conductive line 312 may be formed on the second insulation layer 220 in such a way that the second conductive line 312 may make contact with the second conductive line 312.

In the same way, the third to fifth conductive line 313, 314 and 315 may be arranged on the third to fifth insulation layers 230, 240 and 250, respectively, and respective plugs may be arranged between the vertically neighboring conductive lines 313, 314 and 315. An uppermost plug may penetrate through the second insulation layer 260 and may make contact with the fifth conductive line 315 and the contact pad 330

Accordingly, the semiconductor devices 600 may be connected to the contact structure 810 via the contact pad 330, the connection plug 320, the wiring line 310, the second metal pattern 130, the first metal pattern 120 and the contact via 820.

According to an example embodiment of the present semiconductor package 1000, the interposer 500 may include the separating layer 100 having a plurality of first recesses 110 and a plurality of fine patterned wiring structures 300 and at least a semiconductor device 600 may be arranged on the interposer 500. Particularly, a lowermost insulation layer of the interposer 500 may be provided as the separating layer 600 and the separation layer 600 may be photo imageable dielectric (PID) materials that may be partially decomposed by a light. Thus, the interposer 500 and the carrier may be separated from each other by a radiation of the light without any plump defects or separation defects in the trim process. Accordingly, the interposer 500 may have a sufficient flatness despite the fine-pitched or the fine-patterned wiring structures 310, and thus the contact failures between the semiconductor devices 600 and the contact terminals 800 may be sufficiently prevented in the semiconductor package 1000.

Further, when the semiconductor package 1000 may be mounted on the main board of an electronic apparatus, the contact area between the semiconductor package 1000 and the main board may be enlarged as large as (i.e., by as much as) the combined surface areas of the first recesses 110 to thereby improve the combining force between the semiconductor package 1000 and the main board of the electronic apparatus, as will described in detail hereinafter.

Figure 3:
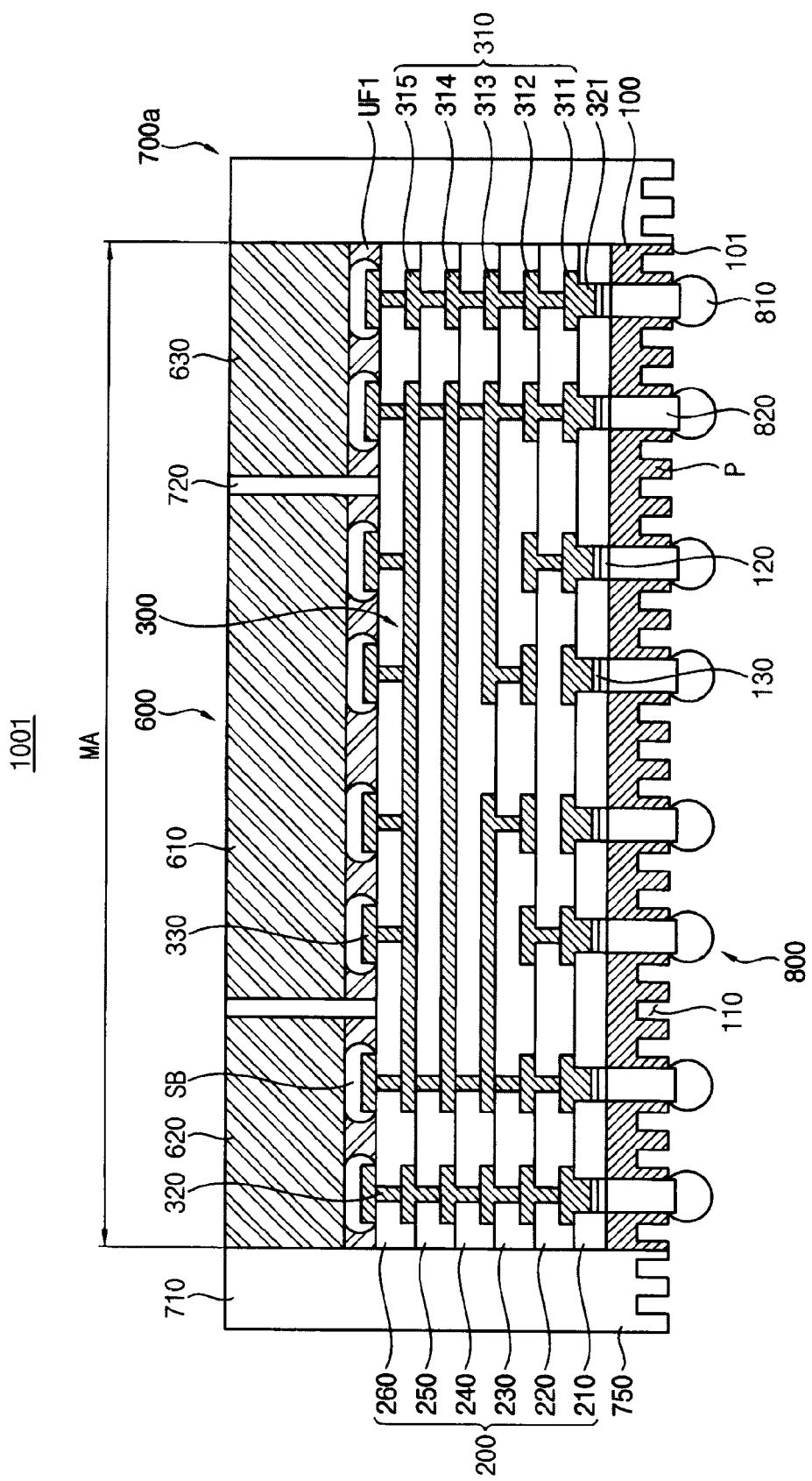
FIG. 3 is a cross-sectional view illustrating a first modification of the semiconductor package shown in FIG. 1.

FIG. 3 is a cross-sectional view illustrating a first modification of the semiconductor package shown in FIG. 1. In FIG. 3, a first modified semiconductor package 1001 may have substantially the same structures as the semiconductor package 1000 shown in FIG. 1, except for a modified securing mold 700a, thus the same reference numerals in FIG. 3 denote the same elements in FIG. 1 and any further detailed descriptions on the same elements will be omitted hereinafter.

Referring to FIG. 3, a first modified semiconductor package 1001 in accordance with an example embodiment of the present disclosure may include an extending mold 750 extending downwards from the package mold 710 and covering a side of the interposer 500. Thus, the modified securing mold 700a may include the package mold 710, the extending mold 750 covering the side of the interposer 500 and the fence mold 720 separating the semiconductor devices 600 in the mounting area MA.

For example, the extending mold 750 may be arranged integrally with the package mold 710 and be extended from the package mold 710. Thus, the extending mold 750 may penetrate through the wiring structures 300, the insulation interlayers 200 and the separating layer 100 in such a way that a lower surface 751 of the extending mold 750 may be coplanar with the rear surface 101 of the separating layer 100.

Therefore, the interposer 500 may be enclosed by the extending mold 750 and the semiconductor devices 600 may be enclosed by the package mold 710 in the mounting area MA, and thus the semiconductor package 1000 may be more sufficiently protected from external shocks and impacts.

Particularly, a plurality of second recesses 760 may be provided on the lower surface 751 of the extending mold 750 in such a way that the second recesses 760 may constitute a single recess matrix together with the first recesses 110.

The lower surface 751 of the extending mold 750 may be coplanar with the rear surface 110 of the separation layer 100 like a single surface, and the first recesses 110 and the second recesses 760 may be formed on the single surface under the same light irradiation. Thus, the first recesses 110 and the second recesses 760 may be formed in the same process, and thus the first recesses 110 and the second recesses 760 may constitute a single matrix structure on the single surface of the lower surface 751 and the rear surface 101.

When the first modified semiconductor package 1001 may be secured onto a main board of an electronic apparatus by using an under fill resin, the contact area between the under fill resin and the first modified semiconductor package 1001 may be enlarged as large as (i.e., by as much as) the combined surface areas of the second recesses 760 to thereby more sufficiently protect the combined structure of the first modified semiconductor package 1001 and the main board of the electronic apparatus from the external shocks and impacts as well as the cracks.

Figure 4:
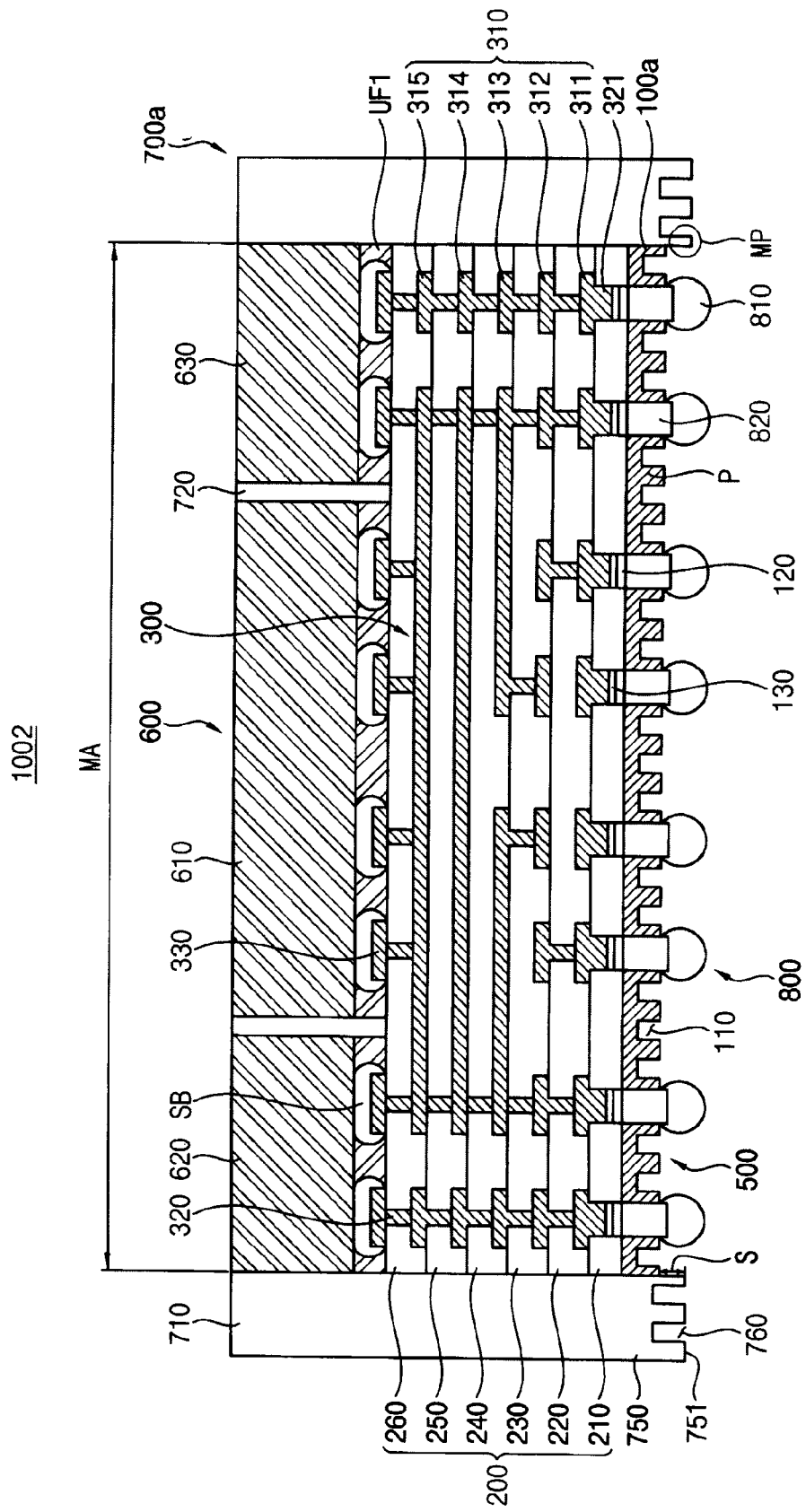
FIG. 4 is a cross-sectional view illustrating a second modification of the semiconductor package shown in FIG. 1.

FIG. 4 is a cross-sectional view illustrating a second modification of the semiconductor package shown in FIG. 1. In FIG. 4, a second modified semiconductor package 1002 may have substantially the same structures as the first modified semiconductor package 1001 shown in FIG. 3, except for a reduced separation layer 100a, thus the same reference numerals in FIG. 4 denote the same elements in FIGS. 1 and 3 and any further detailed descriptions on the same elements will be omitted hereinafter.

Referring to FIG. 4, a second modified semiconductor package 1002 in accordance with an example embodiment of the present disclosure may include a reduced separation layer 100a having a reduced thickness. Thus, the rear surface 101 of the reduced separation layer 100a may be positioned higher than the lower surface 751 of the extending mold 750, so that a rear step S may be arranged between the extending mold 750 and the reduced separation layer 100a.

Thus, the reduced separation layer 100a may have such a small thickness that a tip portion of the extending mold 750 may protrude from the reduced separation layer 100a. That is, a protrusion mold PM may be provided at the tip portion of the extending mold 750 and the rear surface 101 of the reduced separation layer 100a may move upwards from the lower surface 751 of the extending mold 750 as high as the rear step S.

The light may be simultaneously irradiated onto the lower surface 751 of the extending mold 750 and the rear surface 101 of the reduced separation layer 100a to thereby simultaneously form the first recesses 110 and the second recesses 760 on the rear surface 101 and the lower surface 751, respectively. Therefore, the first recesses 110 and the second recesses 760 may be vertically spaced apart from each other as much as the rear step S and may be arranged discontinuously on a whole surface of a rear surface of the interposer 500. The contact area of the second modified semiconductor package 1002 may be enlarged as much as the surface area of the protrusion mold PM to thereby improve the combining force between the second modified semiconductor package 1002 and the main board of the external electronic apparatus.

In the present example embodiment, the rear step S may be in a range of about 1 μm to about 10 μm. When the rear step S may be smaller than about 1 μm, the height of the protrusion mold PM may be so small that the increase of the contact area with the under fill resin may be insignificant and the combining force may not be improved between the second modified semiconductor package 1002 and the external electronic apparatus. In contrast, when the rear step S may be greater than about 10 μm, the gap space between the interposer 500 and the main board may be so spacious that the under fill resin may not be sufficiently filled in the gap space and as a result, the combining force between the second modified semiconductor package 1002 and the external electronic apparatus may be weakened due to the gap fill defect. Accordingly, the rear step S may be in a range of about 1 μm to about 10 μm.

When the second modified semiconductor package 1002 may be mounted on the main board of the electronic apparatus, the contact area between the main board and the second modified semiconductor package 1002 may be enlarged as large as (i.e., by as much as) the combined surface areas of the second recesses 760 to thereby more sufficiently protect the combined structure of the first modified semiconductor package 1001 and the main board of the electronic apparatus from the external shocks and impacts as well as the cracks. In addition, the contact area of the second modified semiconductor package 1002 may be enlarged as much as the surface area of the protrusion mold PM to thereby improve the combining force between the second modified semiconductor package 1002 and the main board of the external electronic apparatus.

In addition, the protrusion mold PM may function as an anchor in the under fill resin between the second semiconductor package 1002 and the main board of the electronic apparatus to thereby much more improve the combining force between the second modified semiconductor package 1002 and the main board of the electronic apparatus.

Figure 5:
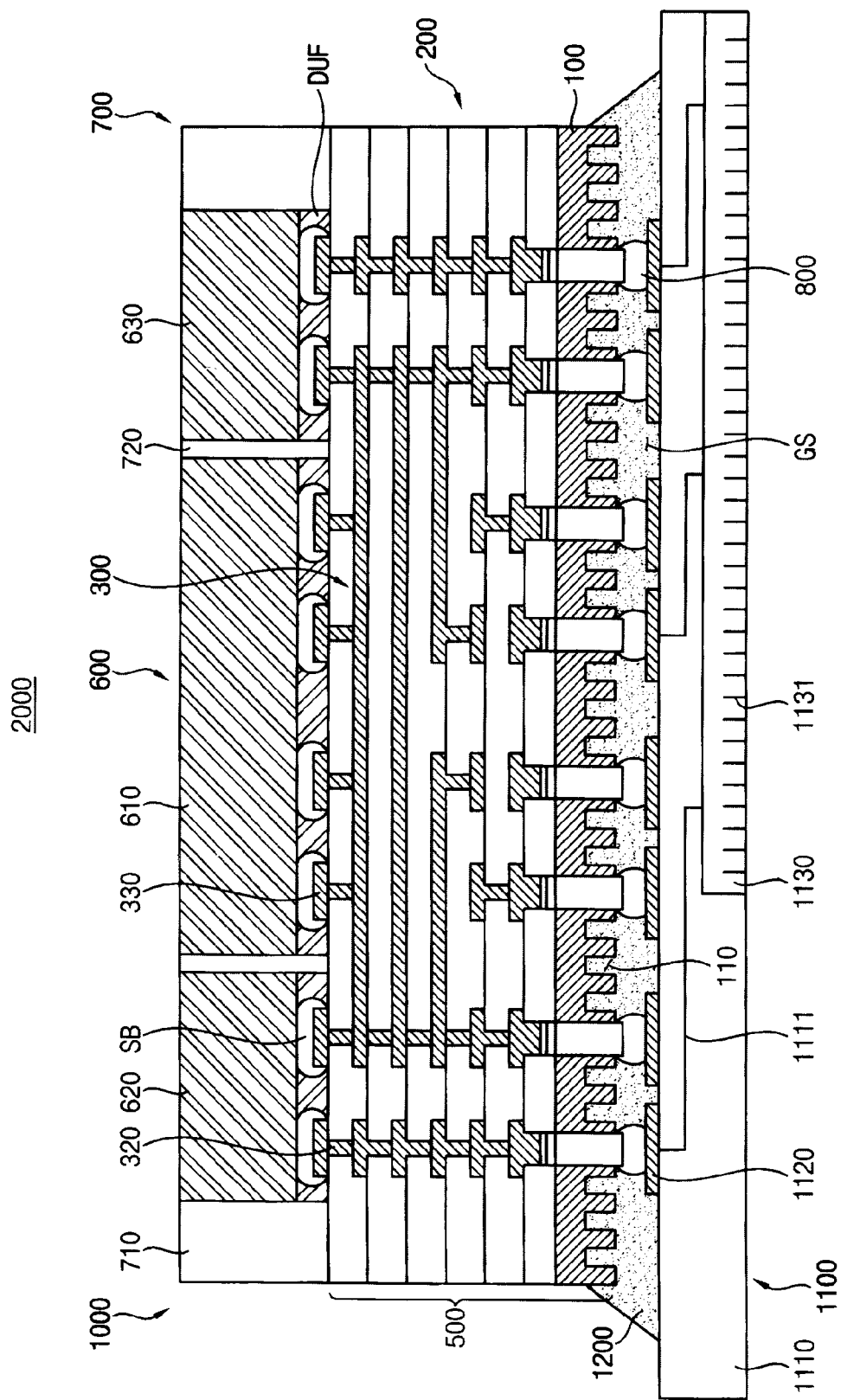
FIG. 5 is a structural view illustrating an electronic apparatus including the semiconductor package shown in FIG. 1.

FIG. 5 is a structural view illustrating an electronic apparatus including the semiconductor package shown in FIG. 1.

Referring to FIG. 5, an electronic apparatus 2000 in accordance with an example embodiment of the present disclosure may include a semiconductor package 1000 including an interposer 500, a plurality of semiconductor devices 600 arranged on the interposer 500 and a plurality of contact terminals 800 on a rear surface of the interposer 500 on which a plurality of first recesses 110 may be arranged, a main board including a plurality of board contact pads 1120 and on which the semiconductor package 1000 may be mounted such that the board contact pads 1120 may be contact with the contact terminals 800 and an under fill resin filling a gap space GS between the main board 1100 and the semiconductor package 1000 such that a plurality of the first recesses 110 may be filled with the gap fill resin 1200 and a contact area of the interposer 500 with the gap fill resin 1200 may be enlarged as much as a surface area of a plurality of the first recesses 110.

The semiconductor package 1000 may have substantially the same structures as the semiconductor package 1000 as described in detail with reference to FIGS. 1 and 2. Thus, a fan out package may be provided as the semiconductor package 1000 of the electronic apparatus 2000.

The main board 1100 may include a body 1110 having a plurality of circuit patterns 1111 therein, a plurality of board contact pads 1120 arranged on an upper surface of the body 1100 and in contact with the contact terminals 800 of the semiconductor package 1000 and a board terminal 1130 arranged on a lower surface of the body 1110 and connected to the board contact pads 1120 and to element devices (not shown) of the electronic apparatus 2000. In the present example embodiment, the main board 1100 may include a printed circuit board (PCB).

The body 1110 may include an insulation body in which the circuit patterns 1111 may be electrically insulated from each other by a plurality of insulation interlayer patterns (not shown). A plurality of the circuit patterns 1111 may include a plurality of conductive lines that may be covered with a pair of the insulation interlayer patterns and may be vertically connected with each other penetrating through the insulation interlayer patterns. The conductive lines may be connected to the board contact pads 1120 and the board terminals 1130.

The board contact pad 1120 may include a conductive pad arranged on the upper surface of the body 1110 and may be connected to the circuit patterns 1111. Particularly, the board contact pad 1120 may make contact with the contact terminal 800 of the semiconductor package 1000 by a soldering contact.

The board terminal 1130 may be connected with other element devices of the electronic apparatus 2000 and may include a plurality of board contacts 1131 connected to a plurality of the board contact pads 1120 and the other element devices of the electronic apparatus.

Thus, the semiconductor devices 600 may be interconnected with one other by the interposer 500 and may be connected to other element devices of the electronic apparatus 2000 via the board contact pads 1120, the circuit pattern 1111 and the board terminal 1130.

The package under fill resin 1200 may fill up the gap space GS between the interposer 500 of the semiconductor package 1000 and the main board 1100, so that the semiconductor package 1000 may be sufficiently protected from the external shocks and impacts and thermal damages by the under fill resin 1200. The package under fill resin 1200 may have substantially the same materials as the device under fill resin DUF in the semiconductor package 1000, so that the package under fill resin 1200 may comprise an insulation resin such as an epoxy.

Particularly, the contact area between the interposer 500 and the package under fill resin 1200 may be enlarged as much as the combined surface areas of the first recesses 110, so that the package under fill resin 1200 may make contact with the interposer 500 on the larger contact area and the combining force for combining the semiconductor package 1000 to the main board 1100 may be sufficiently improved by the first recesses 110.

Accordingly, the physical contact between the contact terminals 800 and the board contact pads 1120 may be sufficiently protected from the external shocks and cracks.

According to the present example embodiment of the electronic apparatus 2000, the semiconductor package 1000 may include the interposer 500 having fine-pitched or fine patterned wiring structures 300 and a sufficient flatness without any plump defects and separation defects, so that the semiconductor package 1000 may be directly mounted on the main board 1100 without any additional board structure. Since the conventional fan-in semiconductor package may be mounted onto the main board of the electronic apparatus 2000 by using an additional board structure, an overall thickness of the electronic apparatus 2000 may be reduced by the thickness of the additional board structure. In addition, the warpage of the electronic apparatus 2000 may be sufficiently protected or minimized due to the omitting of the additional board structure.

Particularly, the interposer 500 may have a sufficient flatness despite the fine-pitched or the fine-patterned wiring structures 310, and thus the contact failures between the semiconductor devices 600 and the contact terminals 800 may be sufficiently prevented in the semiconductor package 1000. Accordingly, the operation reliability of the electronic apparatus 2000 may be sufficiently improved due to the minimized contact failures between the semiconductor devices 600 and the contact terminals 800.

Figure 6:
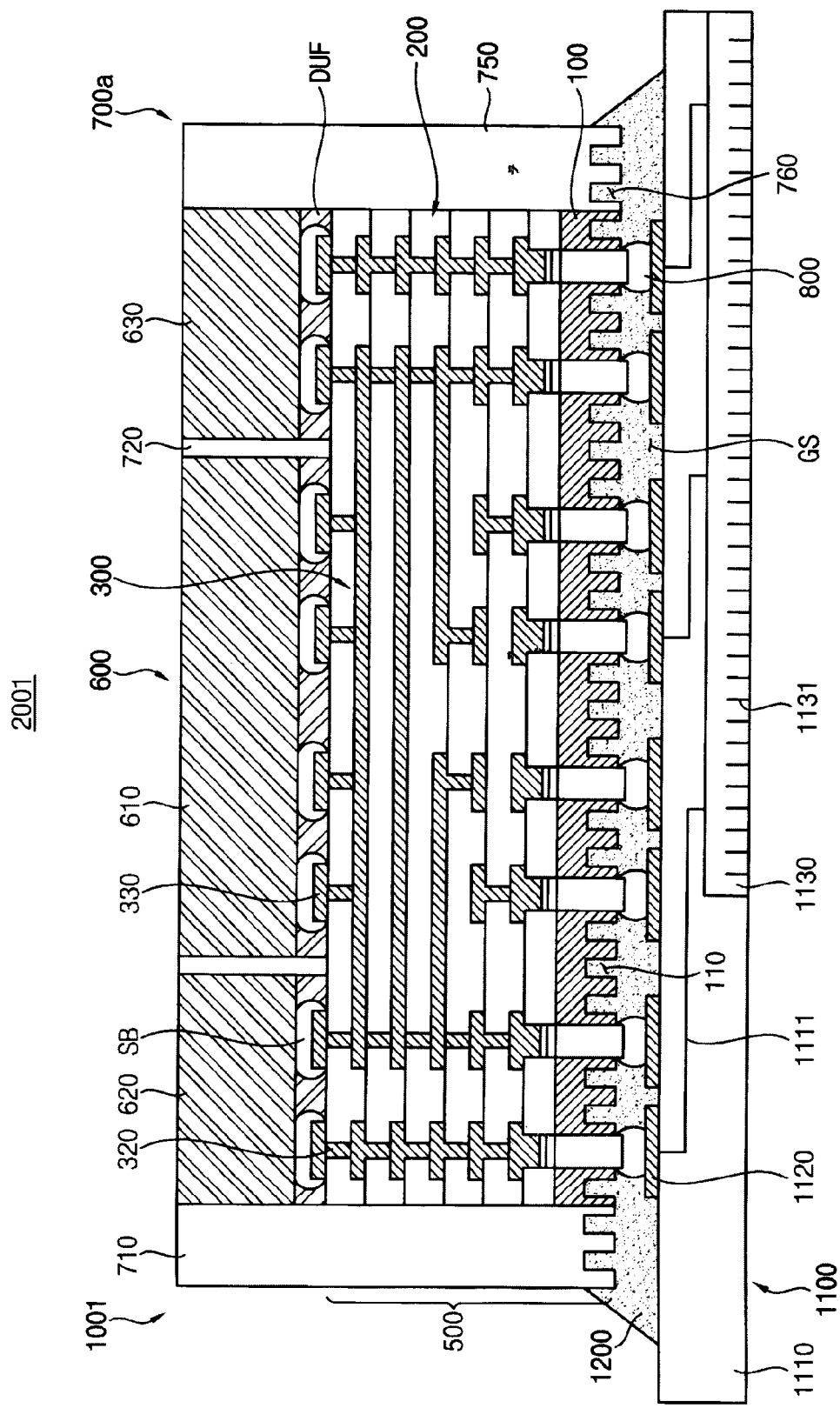
FIG. 6 is a structural view illustrating an electronic apparatus including the semiconductor package shown in FIG. 3.

FIG. 6 is a structural view illustrating an electronic apparatus including the semiconductor package shown in FIG. 3. In FIG. 6, a first modified electronic apparatus 2001 may have substantially the same structures as the electronic apparatus 2000 shown in FIG. 5, except that the first modified semiconductor package 1001 may be mounted on the main board 1100. Thus, the same reference numerals in FIG. 6 denote the same elements in FIG. 5, and any further detailed descriptions on the same elements will be omitted.

Referring to FIG. 6, a first modified electronic apparatus 2001 in accordance with an example embodiment of the present disclosure may include a first modified semiconductor package 1001 in such a configuration that the package under fill resin 1200 may make contact with the second recesses 760 of the extending mold 750 as well as the first recesses 110 of the separation layer 100.

Thus, the contact area between the package under fill resin 1200 and the first modified semiconductor package 1001 may be enlarged as large as (i.e., by as much as) the combined surface areas of the second recesses 760 to thereby more sufficiently protect the first modified electronic apparatus 2001 from the external shocks and impacts.

In addition, since the interposer 500 may be enclosed by the extending mold 750, the damages to the first modified semiconductor package 1001 caused by external shocks and impacts may be minimized by the extending mold 750.

Figure 7:
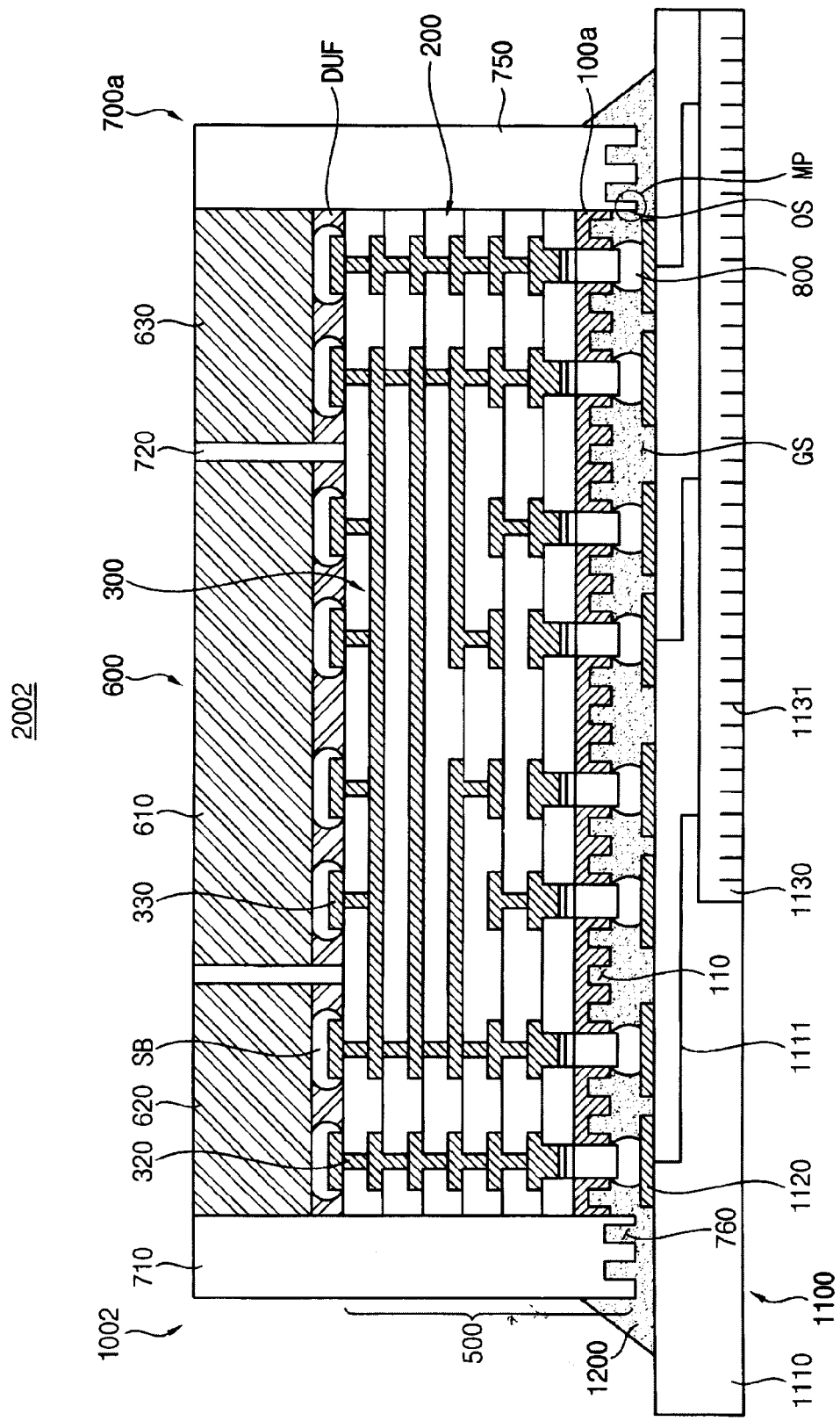
FIG. 7 is a structural view illustrating an electronic apparatus including the semiconductor package shown in FIG. 4.

FIG. 7 is a structural view illustrating an electronic apparatus including the semiconductor package shown in FIG. 4. In FIG. 7, a second modified electronic apparatus 2002 may have substantially the same structures as the electronic apparatus 2000 shown in FIG. 5, except that the second modified semiconductor package 1002 may be mounted on the main board 1100. Thus, the same reference numerals in FIG. 7 denote the same elements in FIG. 5, and any further detailed descriptions on the same elements will be omitted.

Referring to FIG. 7, a second modified electronic apparatus 2002 in accordance with an example embodiment of the present disclosure may include a second modified semiconductor package 1002 in such a configuration that the package under fill resin 1200 may make contact with the side SS surface of the protrusion mold PM as well as the second recesses 760 of the extending mold 750 and the first recesses 110 of the reduced separation layer 100a.

Thus, the contact area between the package under fill resin 1200 and the second modified semiconductor package 1002 may be enlarged as large as (i.e., by as much as) the combined areas of the side surfaces SS of protrusion mold PM around the reduced separation layer 100a as well as the second recesses 760 and the first recesses 110, to thereby more sufficiently protect the second modified electronic apparatus 2002 from the external shocks and impacts.

In addition, the extending mold 750 may extend upwards from the package mold 710 and may be inserted into the under fill resin 1200, so that the extending mold 750 may cover the side of the interposer 500 and may be secured to the under fill resin 1200. That is, the protrusion mold PM may be secured into the package under fill resin 1200 under the reduced separation layer 100a.

Thus, the protrusion mold PM may function as an anchor for securing the second modified semiconductor package 1002 to the main board 1100 of the second modified electronic apparatus 2002 to thereby much more improve the combining force between the second modified semiconductor package 1002 and the main board 1100 and thus to sufficiently prevent the contact failures between the contact terminals 800 and the board contact pads 1120 in the second modified electronic apparatus 2002.

In FIGS. 5 to 7, the semiconductor devices 600 may be interconnected with one another by the interposer 500 and may include at least any one of an ASIC device, a graphic process unit (GPU), a high bandwidth memory (HBM) device, a DRAM device, a flash memory device and a passive device for operating the above devices.

Particularly, the interposer 500 may include the fine-pitched wiring lines 310 and a lowermost insulation layer may be used as the separation layer 100 without any additional separation members, so that the interposer 500 may have sufficient flatness at a rear surface thereof despite the trim process. Therefore, the contact failures between the semiconductor devices 600 and the contact terminals 800 may be sufficiently minimized or prevented despite the fine-pitched wiring lines 310, which may sufficiently improve the operation reliability of the electronic apparatuses 2000, 2001 and 2002 despite the fine-pitched wiring lines 310 of the interposer 500.

In the present example embodiment, the electronic devices 2000, 2001 and 2002 may include a graphic card having a single GPU and at least an HBM. However, any other apparatuses may be provided as the electronic apparatus according to the configurations of the semiconductor devices 600.

Hereinafter, a method of manufacturing the semiconductor packages shown in FIGS. 1 to 4 will be described in detail with reference to FIGS. 8 to 12B.

Figure 8:
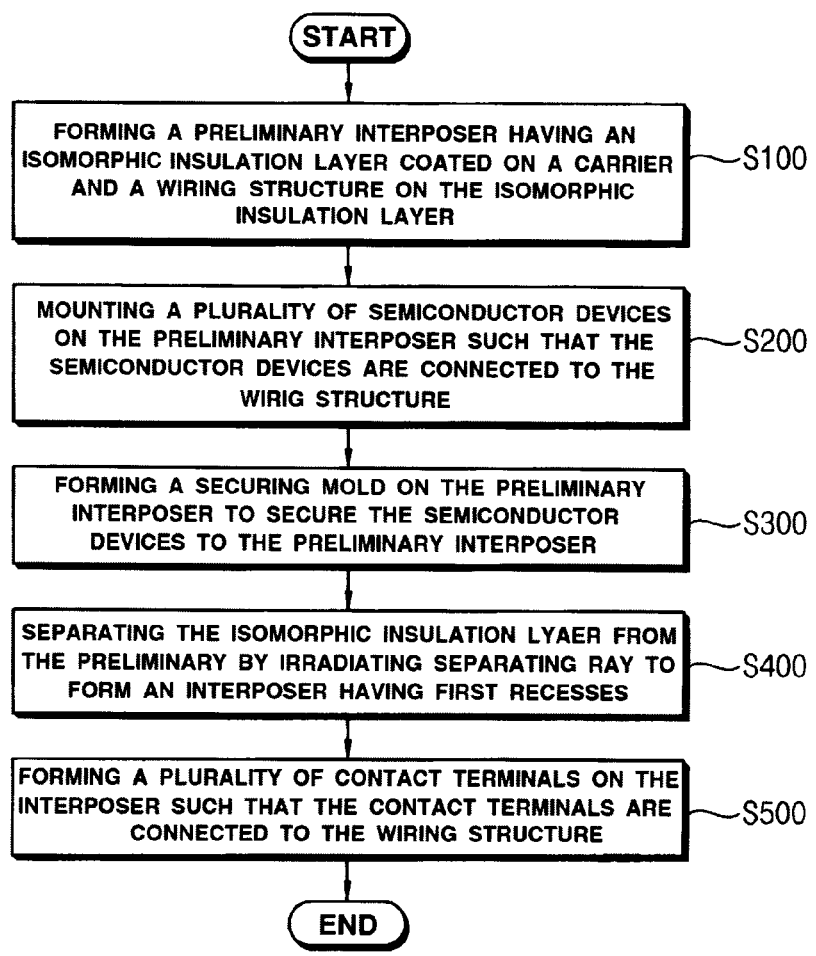
FIG. 8 is a flow chart showing processing steps for a method of manufacturing a semiconductor package in accordance with an example embodiment of the present disclosure.

FIG. 8 is a flow chart showing processing steps for a method of manufacturing a semiconductor package in accordance with an example embodiment of the present disclosure. FIGS. 9A to 9I are cross-sectional views illustrating the processing steps for a method of manufacturing the semiconductor package shown in FIG. 1 in accordance with an example embodiment of the present disclosure.

Referring to FIG. 8, a preliminary interposer 500a may be formed in such a way that a separation layer 100 may be coated on a carrier and a plurality of wiring lines 310 may be formed on the separation layer 100 alternately with the insulation interlayers 200 (step S100).

FIGS. 9A to 9D are cross sectional views illustrating processing steps for a method of forming the preliminary interposer shown in FIG. 8.

Figure 9A:
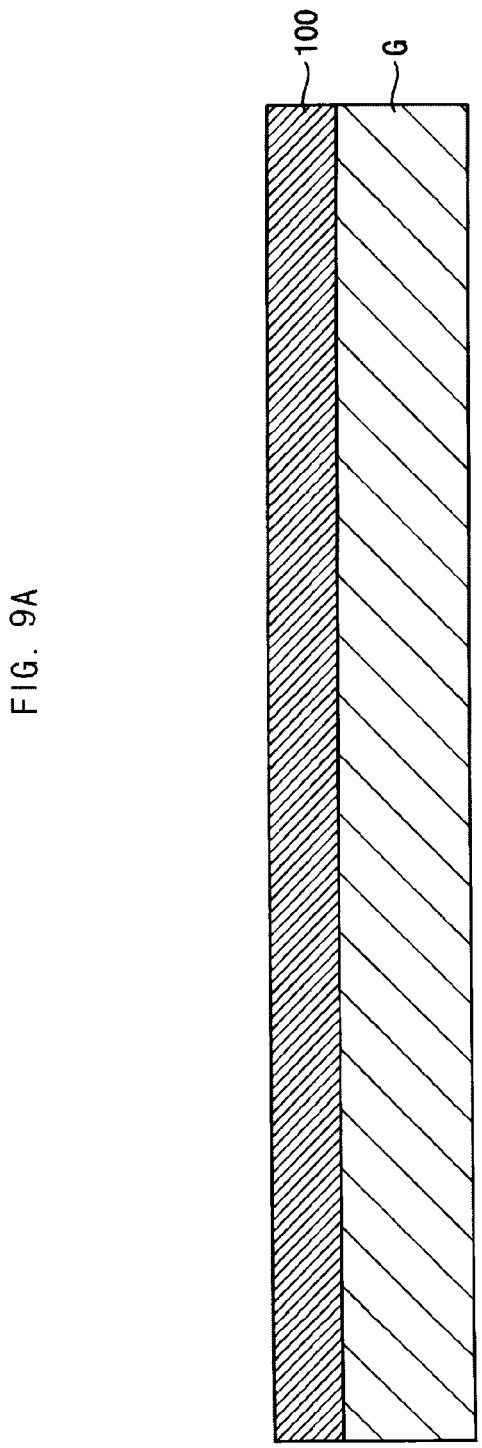
FIGS. 9A to 9I are cross-sectional views illustrating the processing steps for a method of manufacturing the semiconductor package shown in FIG. 1 in accordance with an example embodiment of the present disclosure.

Referring to FIG. 9A, the separation layer 100 may be formed on the carrier G The carrier G may be provided as a temporary base plate for forming the interposer 500 and various plates may be used as the carrier G as long as the insulation interlayers 200 and the wiring structures 300 may be alternately stacked on the plate and the light may transmit through the plate. For example, the carrier G may include a glass carrier or a silicon wafer.

The carrier G may be shaped into a flat panel for a panel level package (PLP) manufacturing process or be shaped into a wafer for a wafer level package (WLP) manufacturing process.

The separation layer 100 may be formed on the carrier G The separation layer 100 may be provided as an insulation layer that may be formed into a portion of the insulation interlayers 200 and may be sufficiently adhered to the carrier G For example, the separation layer 100 may be formed on the carrier G by a coating process or a deposition process. Particularly, the separation layer 100 may be formed into a sufficient thickness for forming the first recesses 110. For example, the separation layer 100 may be formed into a single layer or a dual layer having a first layer having no first recesses and a second layer having the first recesses 110. In such a case, the first layer and the second layer may comprise the same materials or different materials.

The separation layer 100 may comprise photo imageable materials (PID) in such a way that the separation layer 100 may be partially reformed by the light. Thus, the composition of the separation layer 100 may be partially changed at every point to which the light may be irradiated. In the present example embodiment, the separation layer 100 may be formed to a thickness of about 1 μm to about 100 μm.

Particularly, a surface of the separation layer 100 may be sufficiently flat and thus the wiring structures 300 may be formed into fine patterns of which the pitch may be sufficiently small and minute.

Examples of the PID may include polybenzoxyzole (PBP), polyimide and benzocyclobutene (BCB), etc. The PID may have a sufficient adherence to the carrier G and sufficient insulation characteristics for insulating the wiring structures 300.

Figure 9B:
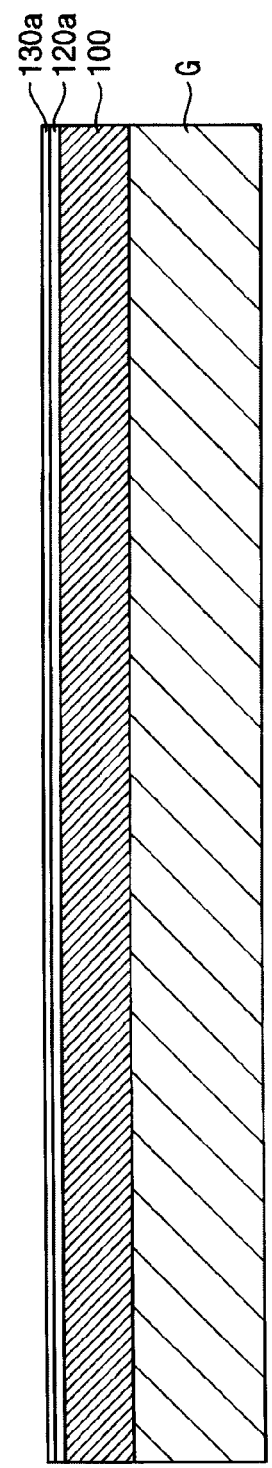

Referring to FIG. 9B, a first metal layer 120a and a second metal layer 130a may be sequentially formed on the carrier G.

For example, the first metal layer 120a may comprise an under bump metal that may be connected to the contact terminals 800 in a subsequent process and the second metal layer 130a may comprise a seed metal for forming the wiring structure 300. In the present example embodiment, the first metal layer 120a may comprise any one of titanium (Ti), tantalum (Ta) and tungsten (W) and the second metal layer 130a may comprise one of copper (Cu) and aluminum (Al).

The first and the second metal layers 120a and 130a may be formed on the separation layer 100 by a deposition process or a coating process.

Figure 9C:
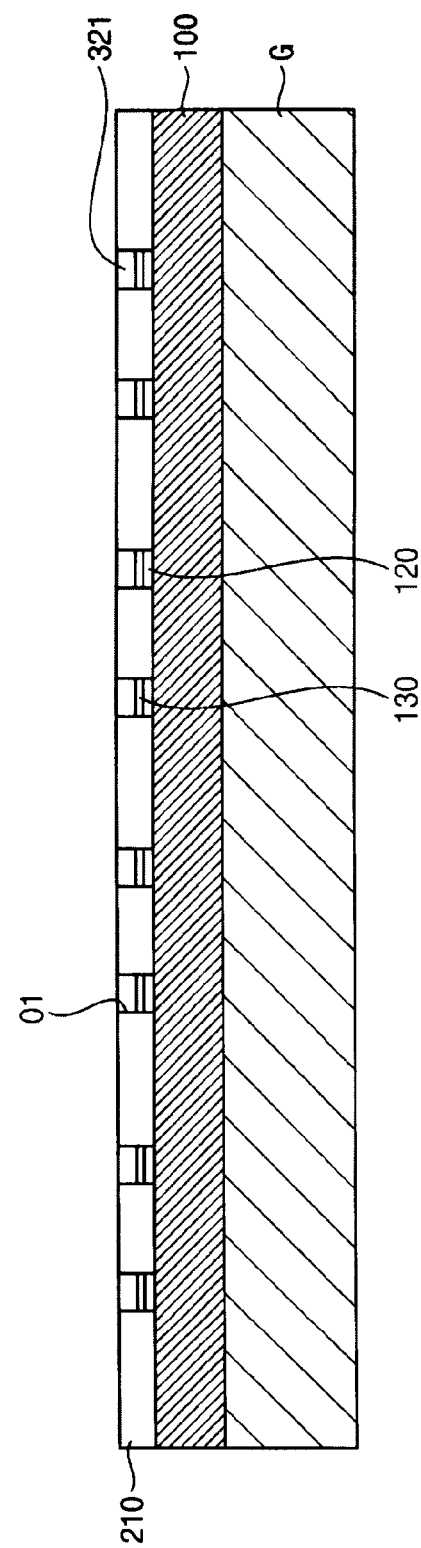

Referring to FIG. 9C, the first and the second metal layer 120a and 130a may be patterned into first and second metal patterns 120 and 130, respectively, and then the lowermost plug 321 may be formed on the second metal pattern 130.

A mask pattern (not shown) may be formed on the second metal layer 130a and the first and second metal layers 120a and 130a may be partially etched off by an etching process using the mask pattern as an etching mask. Therefore, only the masked portions of the first and the second metal layers 120a and 130a corresponding to areas of the contact terminals 800 (referred to as bump areas) may remain on the separation layer 100, to thereby form the first and second metal patterns 120 and 130 that may be stacked on the bump areas of the separation layer 100. Thus, some of the separation layer 100 may be covered with the first and the second mask patterns and the others of the separation layer 100 may be exposed to surroundings.

In the present example embodiment, the first metal pattern 120 may include the under bump metal (UBM) making contact with the contact via 820 of the contact terminal 800 and the second metal pattern 130 may include a seed pattern for plating the wiring structures 300.

Then, the first insulation layer 210 may be formed on the separation layer 100 to a sufficient thickness to cover the first and second metal patterns 120 and 130. Thereafter, the first insulation layer 210 may be partially removed from the separation layer 100, to thereby form a plurality of first penetration holes 01 through which a plurality of the second metal patterns 130 may be exposed, respectively.

A plating process may be simultaneously conducted in the first penetration holes by using the respective second metal pattern 130 as a seed layer, to thereby form the lowermost plugs 321 in each of the first penetration holes.

Figure 9D:
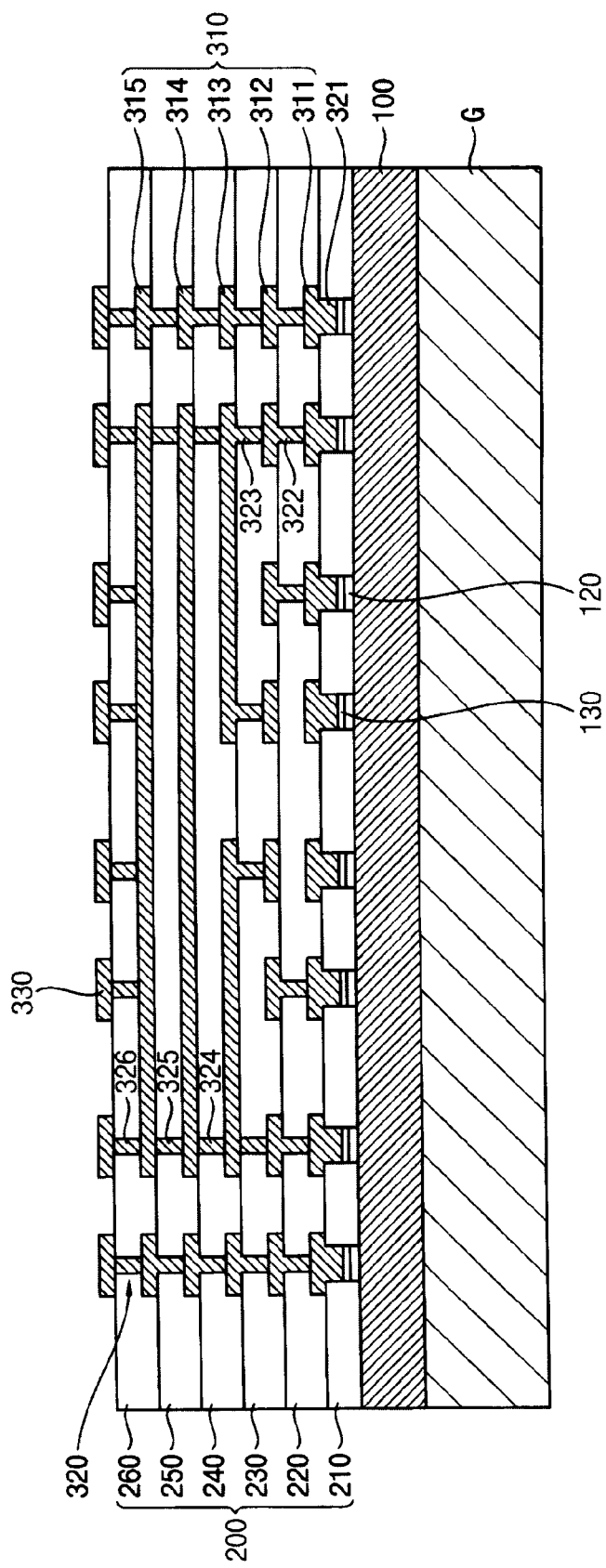

Referring to FIG. 9D, a conductive layer (not shown) may be formed on the first insulation layer 210 by a deposition process in such a way that the conductive layer may make contact with the lowermost plugs 321 and then may be patterned into a plurality of first conductive lines 311.

In contrast, the first conductive lines 311 may be directly formed on the separation layer 100 by a plating process by using the lowermost plugs 321 as a seed. For example, the plating process may include a subtractive plating process, an additive plating process, a semi-additive plating process and a modified semi-additive plating process.

Thereafter, the second insulation layer 220 may be formed on the first insulation layer 210 to a sufficient thickness to cover the first conductive lines 311 and may be partially removed from the first insulation layer 210 to thereby form second penetration holes through which the first conductive lines 311 may be partially exposed. Then, a plurality of first plugs 322 may be formed in the second penetration holes by the plating process in such a way that each of the first plugs 322 may make contact with the first conductive line 311. The second conductive lines 312 may be formed on the second insulation layer 220 by the same process for forming the first conductive lines 311. In the same way, the third insulation layer 230, the second plugs 323, the third conductive lines 313, the fourth insulation layer 240, the third plugs 324, the fourth conductive lines 314, the fifth insulation layer 250, the fourth plugs 325, the fifth conductive lines 315, the sixth insulation layer 260, the fifth plugs 326 and a plurality of contact pads 330 making contact with the fifth plugs 326 are formed. A plurality of the contact pads 330 may be arranged on the upper surface of the preliminary interposer 500*a* in a matrix shape.

In the present example embodiment, the wiring lines 300 may include 6 insulation layers 210 to 260 and 5 conductive lines 311 to 315. However, the wiring structure 300 may also include more or less than 5 conductive lines according to the characteristics and requirements of the interposer 500.

The wiring lines 310 may function as re-directional lines for connecting the bonding pads (not shown) of the semiconductor devices 600 to the contact terminals 800.

Accordingly, the preliminary interposer 500*a* may be formed on the carrier G in such a way that the separation layer 100 may be formed on the carrier G and the insulation interlayers 200 and the wiring structures 300 may be alternately stacked on the separation layer 100.

Then, the preliminary interposer 500*a* may be separated into a plurality of trim panels for improving the process efficiency of manufacturing the semiconductor package 1000 and an edge patterning process may be applied to each trim panel for preventing or minimizing the separation defects at an edge portion of the preliminary interposer 500*a*. Thus, the preliminary interposer 500*a* may be separated into the trim panels before the mounting process of the semiconductor packages.

Figure 10B:
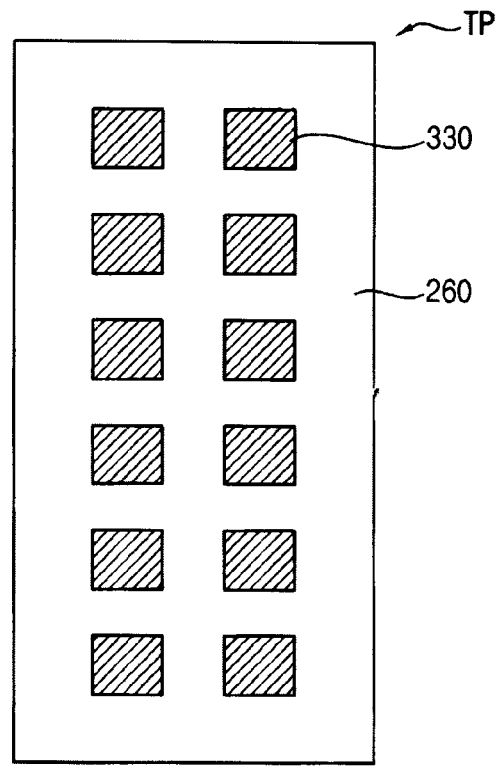
Figure 10C:
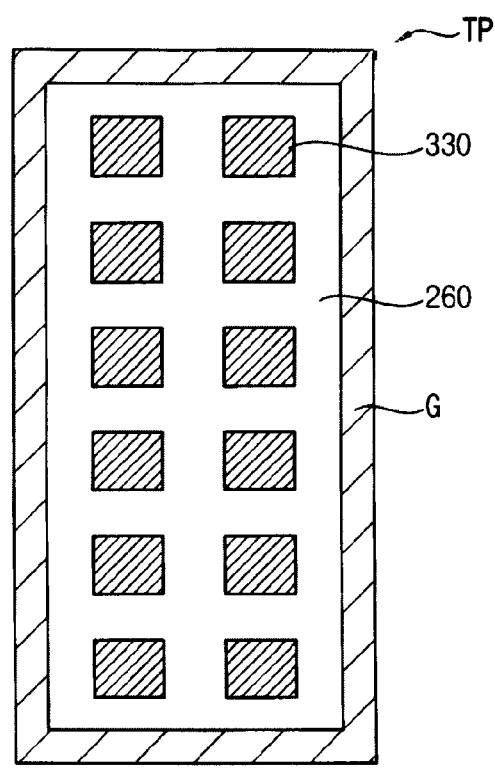

FIGS. 10A to 10C are cross-sectional views illustrating the processing steps for a method of applying the trim process to the preliminary interposer 500*a* shown FIG. 9D.

Referring to FIG. 10A, cutting information for the preliminary interposer 500*a* may be transferred to a cutting tool (not shown) with respect to a whole surface of the carrier G The cutting information may include a cutting line CL along which the preliminary interposer 500*a* may be cut and the preliminary interposer 500*a* may be separated into trim panels TP having a size smaller than that of the preliminary interposer 500*a*.

For example, three cutting lines CL may be set in the cutting tool, and thus the preliminary interposer 500*a* may be separated into 4 trim panels TP. The number of the cutting lines CL may be varied according to the number of the semiconductor devices 600 that may be mounted on each of the trim panels TP. For example, the preliminary interposer 500*a* may be separated into one of 2, 6, 8, 16 and 32 trim panels TP.

The mounting process of the semiconductor devices 600 and the carrier de-bonding process may be applied to each trim panel TP, so that various process defects such as the separation defect between the separation layer 100 and the carrier may be controlled by a unit of the trim panel TP, thereby increasing the process efficiency of the manufacturing process of the semiconductor package 1000.

Referring to FIG. 10B, the preliminary interposer 500*a* may be cut along the cutting line CL and may be separated into 4 trim panels by the cutting tool.

The cutting tool may include a laser cutter, and thus a laser beam may be irradiated onto the preliminary interposer 500*a* along the cutting line CL. Then, the wiring structures 300, the insulation interlayers 200, the separation layer 100 and the carrier G may be sequentially cut along the cutting line CL, and the trim panel TP may have the same stack structures as the preliminary interposer 500*a* except for a size. That is, the trim panel TP may be a downsized preliminary interposer.

In the present example embodiment, the preliminary interposer 500*a* may be cut by an optical cutting process, not by a mechanical cutting process such as a sawing process, so that the plump defect or the separation defect between the carrier G and the separation layer 100 may be prevented or significantly minimized. Further, no additional member for separating the separation layer 100 and the carrier G may be required between the separation layer 100 and the carrier G because the cutting of the preliminary interposer 500*a* may be conducted by the optical cutting process.

Accordingly, the adherence between the separation layer 100 and the carrier G may not be deteriorated in the trim process, so that the flatness of the separation layer 100 in the trim panel TP may be sufficiently maintained despite the trim process.

Referring to FIG. 10C, the edge patterning process may be further applied to the trim panel TP in such a way that the wiring structures 300, the insulation interlayers 200 and the separation layer 100 may be further removed from an edge portion of the trim panel TP and the edge portion of the trim panel TP may be exposed.

Thus, the wiring structures 300, the insulation interlayers 200 and the separation layer 100 may just remain on most of the carrier G except for the edge portion thereof.

In a subsequent carrier de-bonding process for separating the separating layer 100 from the carrier G, some of the separation layer 100 may not be separated from the edge portion of the carrier G and the separation defect may occur at the edge portion of the carrier G However, since the wiring structures 300 and the insulation interlayers 200 may be removed from the edge portion of the carrier G as well as the separation layer 100 by the edge patterning process, no separation defect may occur at the edge portion of the carrier G in the de-bonding process.

In the present example embodiment, the edge patterning process may be conducted consecutively to the trim process, so that the preliminary interposer 500*a* may be separated into the trim panel TP by the laser irradiation and continuously the insulation interlayers 200 and the separation layer 100 may be removed from the edge portion of the trim panel TP by the same laser irradiation.

Thereafter, a plurality of the semiconductor devices 600 may be mounted on the trim panel TP in such a way that the semiconductor devices 600 may be arranged side by side (step S200) and then the semiconductor devices 600 may be secured to the trim panel TP by the securing mold 700 (step S300).

Figure 9E:
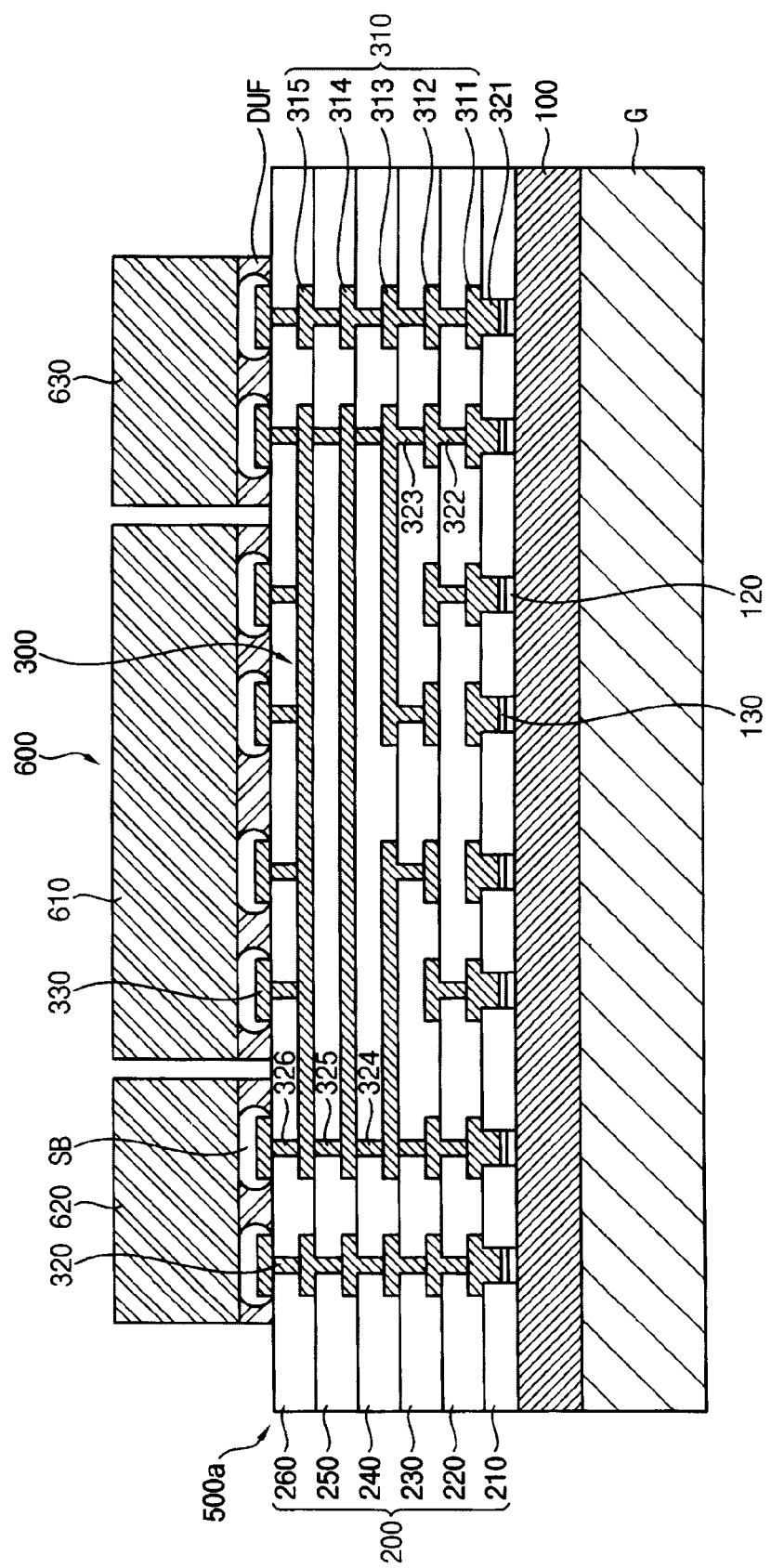

FIG. 9E is a cross sectional view illustrating a processing step for a method of mounting semiconductor devices onto the trim panel TP shown in FIG. 8.

Referring again to FIG. 9E, the semiconductor devices 600 may be arranged on the upper surface of the trim panel TP in such a way that the bonding pads (not shown) of the semiconductor devices 600 may be aligned with the contact pads 330 and then a thermal compression may be applied to the semiconductor devices 600 in such a way that the bonding pads may be bonded to the contact pads 330. For example, the bonding pads and the contact pads 330 may be bonded to each other by a soldering process.

Then, a gap space between the semiconductor devices 600 and the $6^{th}$ insulation layer 260 may be sufficiently filled with device under fill resin DUF, so that the semiconductor devices 600 may be prevented from external shocks and impact, external heat damages, and cracks.

Figure 9F:
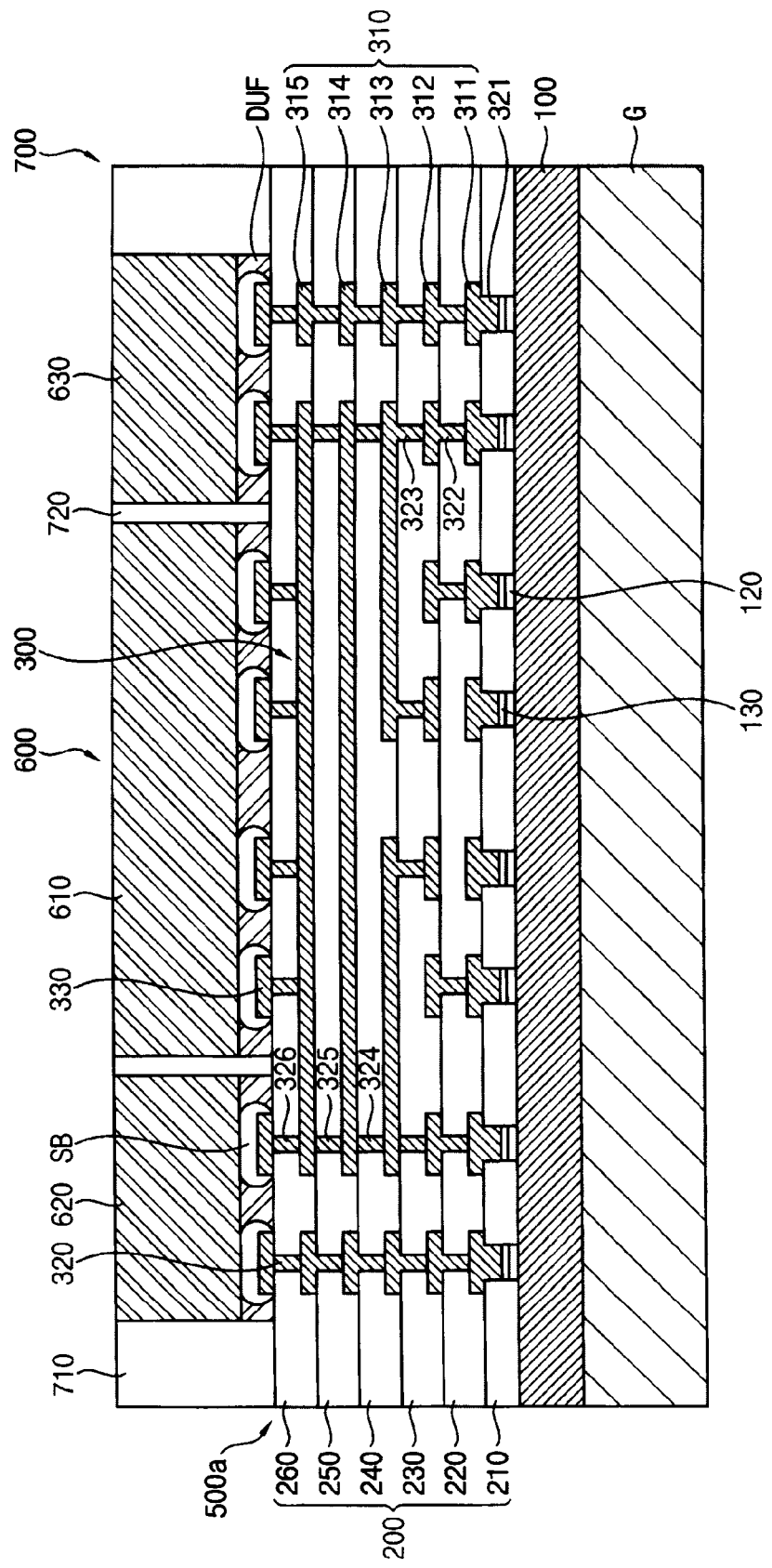

FIG. 9F is a cross sectional view illustrating a processing step for a method of forming a securing mold on the trim panel to secure the semiconductor devices onto the trim panel TP shown in FIG. 8.

Referring to FIG. 9F, a mold layer (not shown) may be formed on the $6^{th}$ insulation layer 260 to a sufficient thickness to cover the semiconductor devices 600 and then may be planarized until a top surface of the semiconductor devices 600 may be exposed. Thus, the securing mold 700 may be formed on the $6^{th}$ insulation layer in such a configuration that a top surface of the securing mold 700 may be coplanar with the top surface of the semiconductor devices 600.

For example, a liquefied mold resin may be coated on the 6th insulation layer 260 and then may be hardened into the securing mold 700.

Then, a heat spreader (not shown) may be further arranged on the semiconductor devices 600. The planarization process to the mold layer may include a grinding process.

Thereafter, the separation layer 100 and the carrier G may be separated from each other, to thereby form the interposer 500 having a plurality of first recesses 110 on the rear surface 101 thereof (step S400).

Figure 9G:
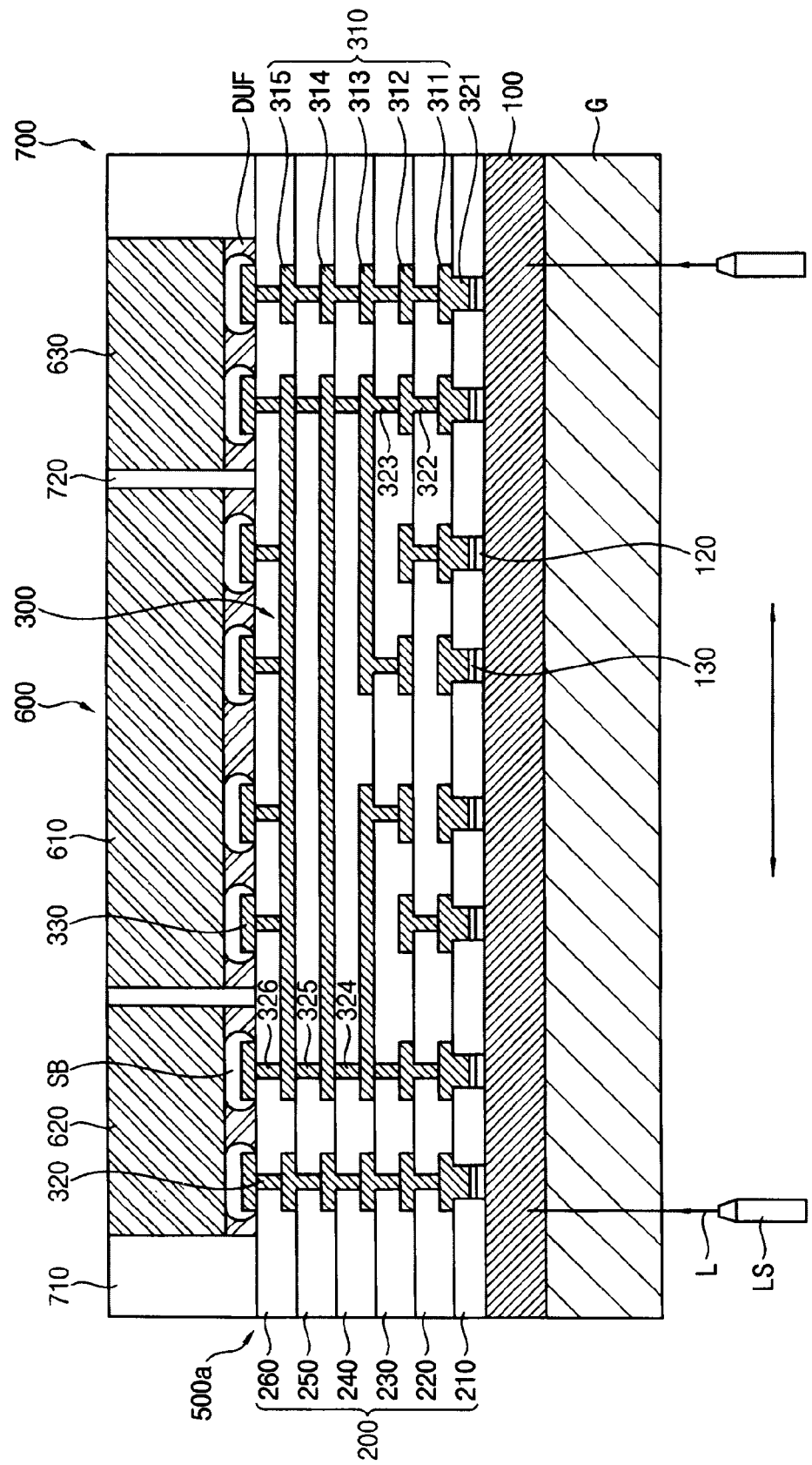
Figure 9H:
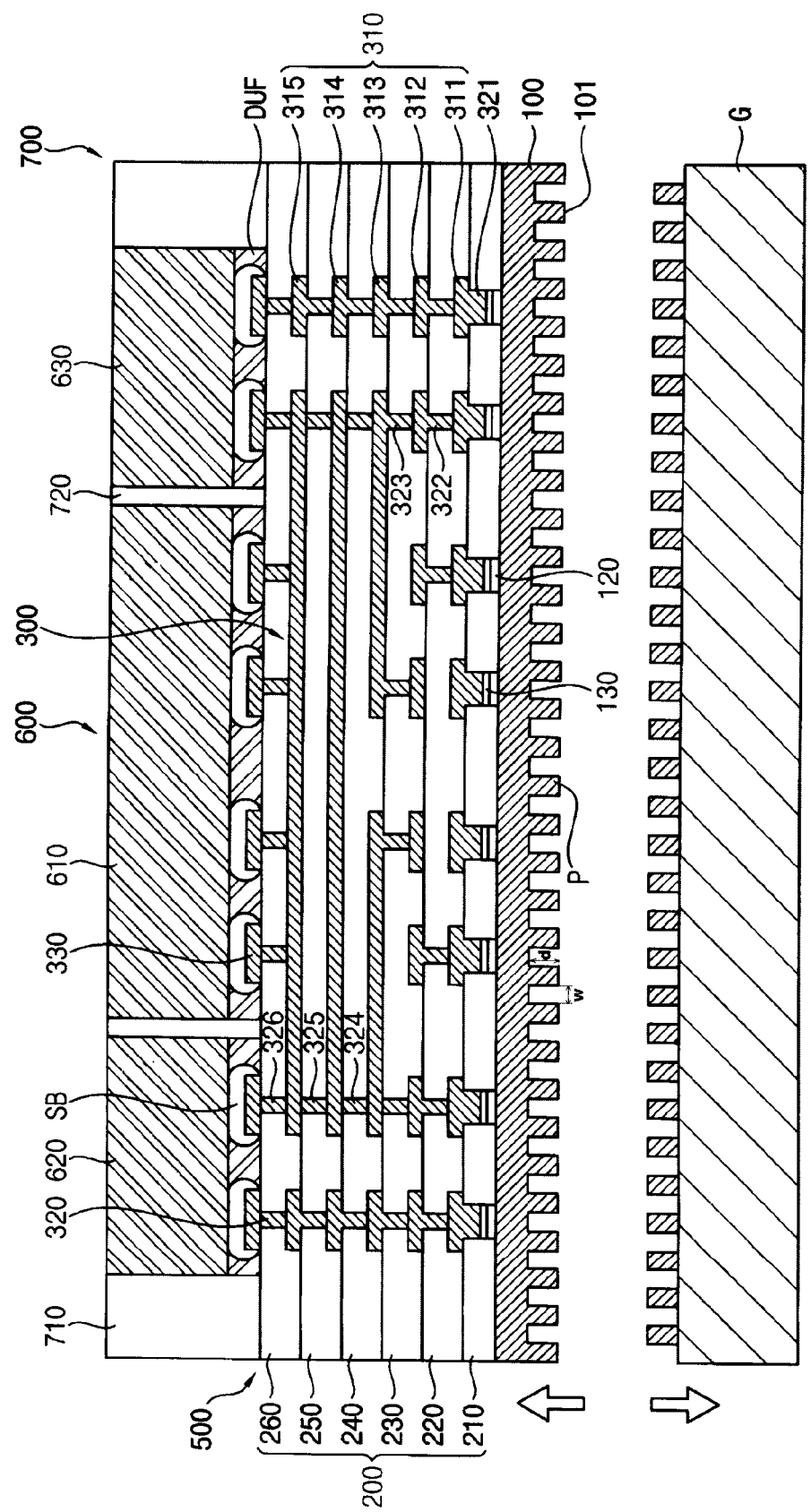

FIGS. 9G to 9H are cross sectional views illustrating processing steps for a method of separating the separation layer from the carrier to thereby form the interposer shown in FIG. 8.

Referring to FIG. 9G, a light L may be irradiated onto the carrier G of the trim panel TP until the separation layer 100 may be partially reformed. That is, the composition of the separation layer 100 may be partially changed in response to the light L.

For example, a laser beam may be irradiated onto the carrier G from a light source LS that may be positioned under the carrier G. The laser beam may penetrate through the carrier G and a lower portion of the separation layer 100 may be reformed in response to the laser beam. Thus, the composition of the separation layer 100 may be changed around the irradiation point where the laser may be irradiated.

Particularly, the light source LS may move under the carrier G with a predetermined irradiation rule and the laser beam may be discontinuously irradiated onto the carrier G. Thus, the irradiation points of the laser beam may be arranged on a whole surface of the carrier G in a matrix, so that the reformation points of the separation layer 100 may also be arranged in the same matrix.

In the present example embodiment, the light L may include a diode pumped solid state (DPSS) laser that may be irradiated onto the carrier G as a Gauss beam. Thus, the laser may be irradiated onto the irradiation point of the separation layer 100 as a square wave and a plane wave just by controlling the position of the light source LS. The size and shape of the first recesses 110 may be varied according to the wave shape of the light L. In addition, the width w of the first recesses 110 may be varied according to the optical intensity of the light L.

The light L may penetrate through the carrier G and reach a predetermined depth of the separation layer 100 at the irradiation point, and thus the composition of the separation layer 100 may be partially changed into a soft melting state or a sol state at the irradiation point.

For example, when the separation layer 100 may comprise polyimide, the carbon (C) in the polyimide may be generated into carbon dioxide ($CO_2$) gases or carbon oxide (CO) gases by an optical reaction with the light L and the $CO_2$ gases or CO gases may be diffused outwards from the separation layer 100 at the irradiation point. That is, the separation layer 100 may be partially changed into the soft melting state or the sol state at the irradiation point.

Referring to FIG. 9H, when the separation layer 100 may be sufficiently changed into the soft melting state or the sol state, the carrier G may be forced to be separated from the separation layer 100 by the carrier de-bonding process in such a way that the soft melting portion may be removed from the separation layer 100 and may remain on the carrier G. A sufficient external force may be applied to the carrier G in such a way that the carrier G may be de-bonded from the separation layer 100.

Therefore, the first recesses 110 each of which may have a depth d and a width w may be arranged on a rear surface of the separation layer 100. A plurality of the first recesses 110 may be arranged on a whole rear surface of the separation layer 100 in such a configuration that the first recess 110 and a protrusion P may be alternately repeated on the rear surface of the separation layer 100.

According to the conventional de-bonding process, the separation defects occur at the edge portion of the carrier G when the carrier G may be separated from the separation layer 100. However, according to the present example embodiment of the disclosure, the separation layer 100 may have been removed from the edge portion of the carrier G until (i.e., to the extent that) an upper surface of the carrier G may be exposed at the edge portion in the edge patterning process, and thus no separation defects may occur on the edge portion of the carrier G.

Thereafter, a plurality of the contact terminals 800 may be formed on the rear surface of the separation layer 100 (step S500), to thereby form the fan-out semiconductor package in which a plurality of the semiconductor devices 600 may be mounted on the interposer 500.

Figure 9I:
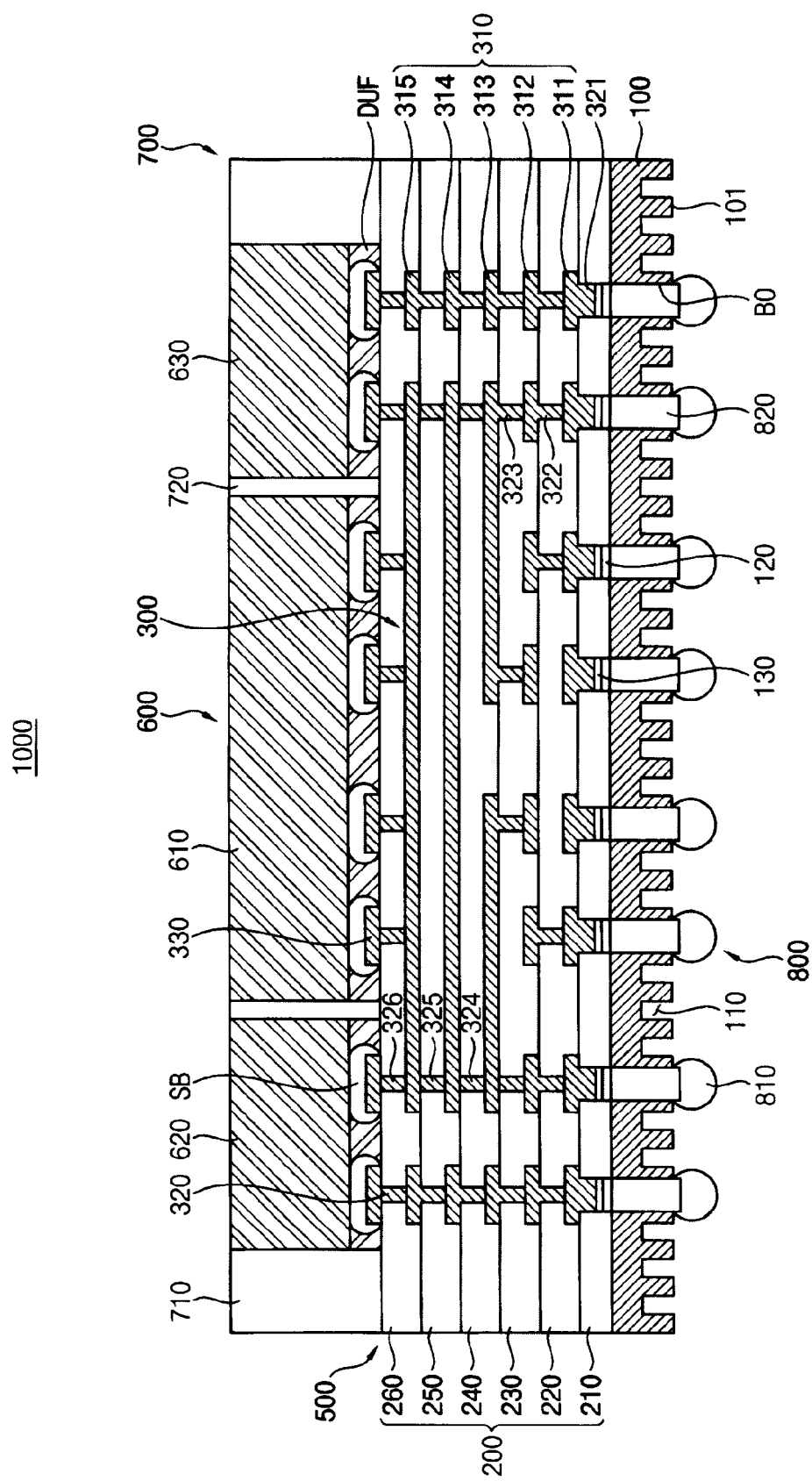

FIG. 9I is a cross sectional view illustrating a processing step for a method of forming a plurality of contact terminals on the separation layer shown in FIG. 8.

Referring to FIG. 9I, a laser beam may be irradiated onto the rear surface of the separation layer 100 and the separation layer 100 may be partially removed, so that a plurality of bottom openings BO through which the first metal patterns 120 may be exposed may be formed on the rear surface of the separation layer 100. Thereafter, conductive materials may be filled into the bottom openings BO, and thus a plurality of the contact vias 820 may be formed in the bottom openings BO. Then, a reflow process may be applied to each of the contact vias 820 and a plurality of the contact structures 810 may be formed on the contact vias 820, respectively.

The contact structure 810 may include a solder bump and the contact via 820 may include an under bump metal (UBM) making contact with the contact structure 810. Particularly, the first metal pattern 120 may include the under bump metal (UBM) and the contact resistance between the contact via 820 and the lowermost plug 321 may be minimized in the semiconductor package 1000.

Accordingly, the semiconductor package 1000 shown in FIG. 1 may be manufactured by the above processing steps. Particularly, the separation layer may comprise photo sensitive insulation materials such as PID without an additional separation member; and the trim process, the edge patterning process and the carrier de-bonding process may be conducted by the light irradiation. Accordingly, the separation layer 100 may have a sufficient flatness on the rear surface thereof after the trim process and the carrier de-bonding process, so that the bonding pads of the semiconductor devices 600 may be sufficiently well connected to the contact terminals despite the fine-patterned wiring structures 300.

Particularly, a plurality of first recesses 110 may be arranged on the rear surface of the separation layer 100. When the semiconductor package 1000 may be mounted on the main board 1100 of an electronic apparatus 2000, the contact area between the semiconductor package 1000 and the main board 1100 may be enlarged as large as (i.e., by as much as) the combined surface areas of the first recesses 110 to thereby improve the combining force between the semiconductor package 1000 and the main board 1100 of the electronic apparatus 2000.

Figure 11A:
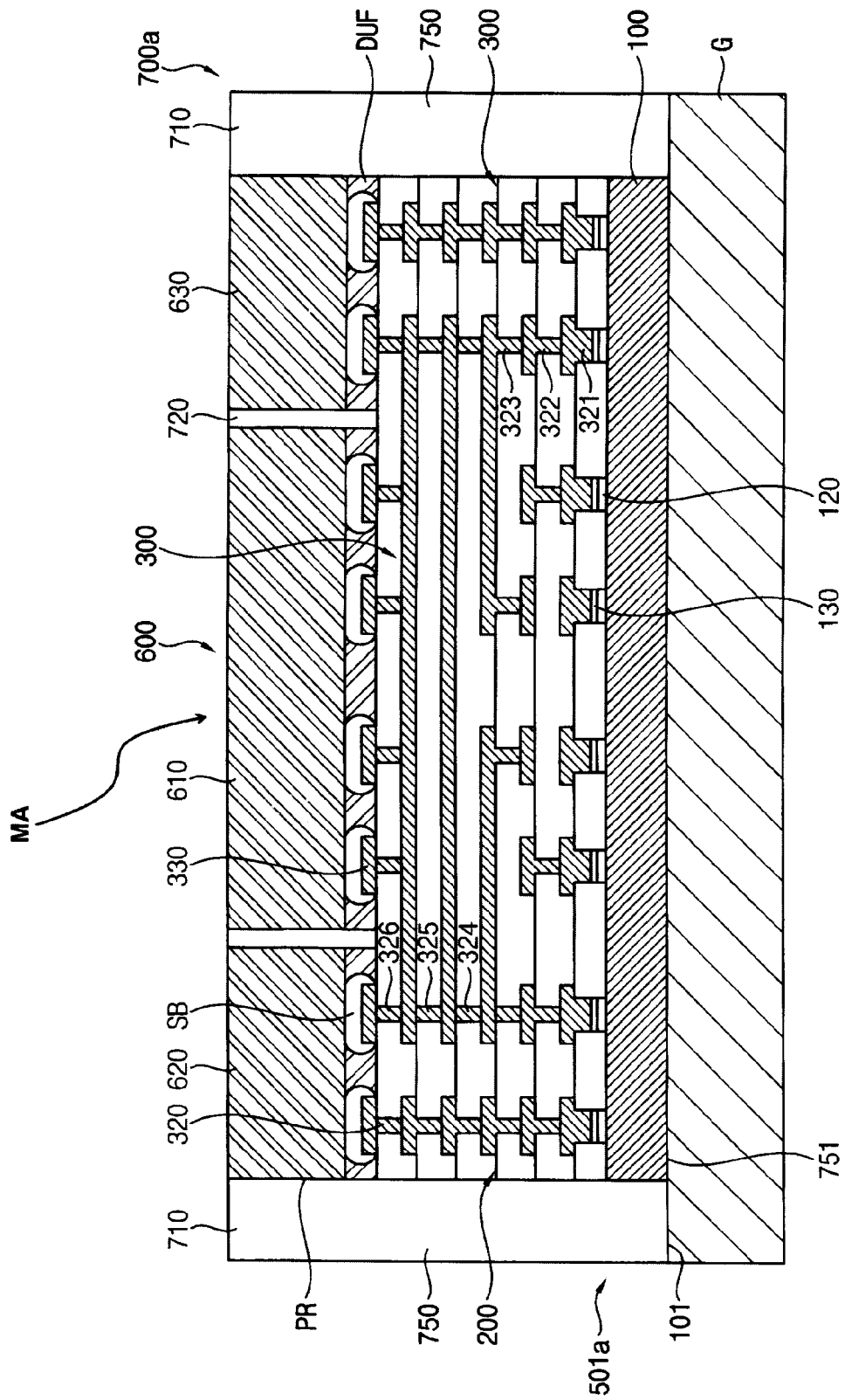
FIGS. 11A to 11C are cross-sectional views illustrating processing steps for a method of manufacturing a first modified semiconductor package shown in FIG. 3.
Figure 11B:
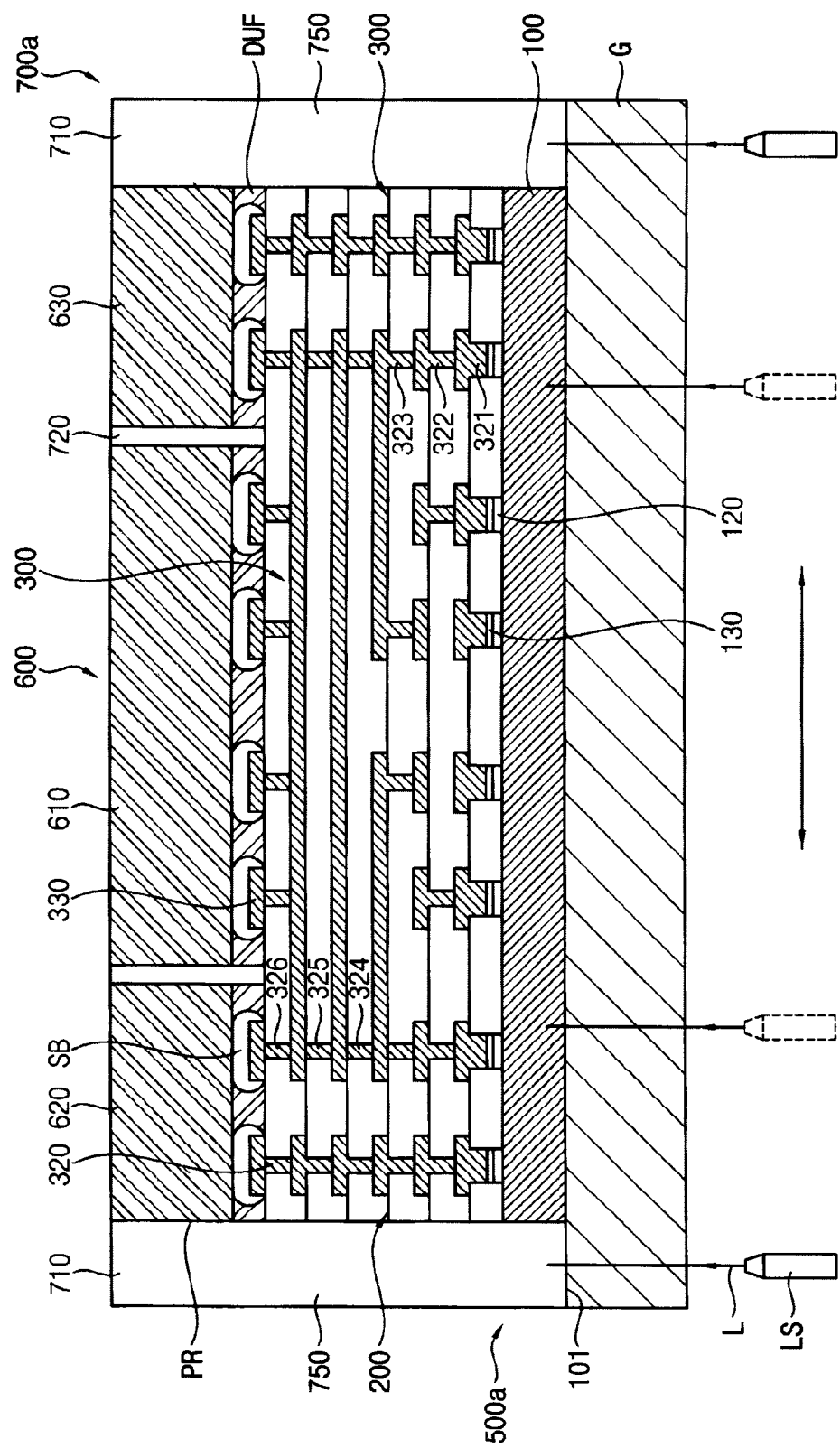
Figure 11C:
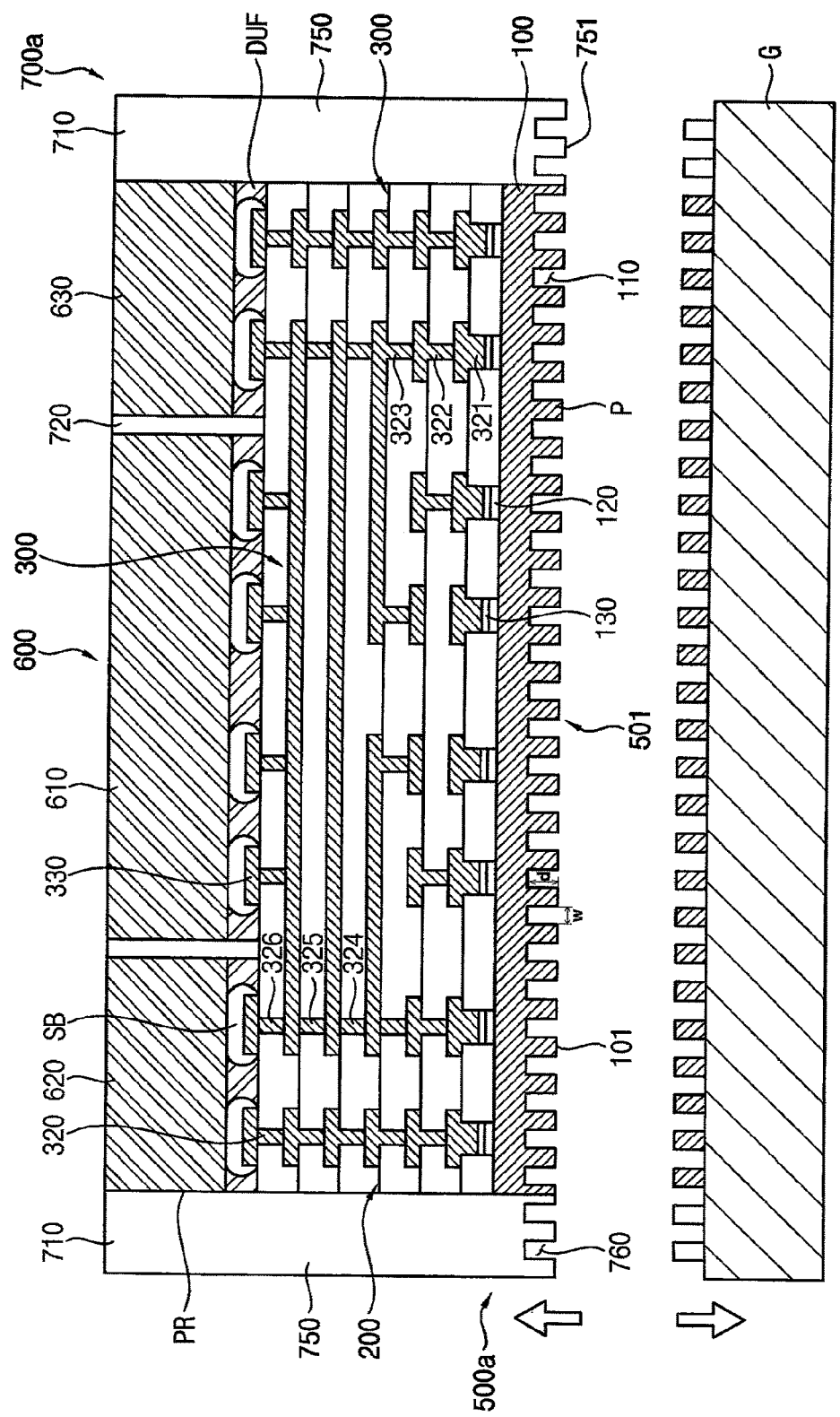

FIGS. 11A to 11C are cross-sectional views illustrating processing steps for a method of manufacturing a first modified semiconductor package shown in FIG. 3.

Referring to FIG. 11A, the extending mold 750 may be provided with a first preliminary modified interposer 501a. The extending mold 750 may extend from the package mold 710 to the carrier G until the extending mold 750 may make contact with the carrier G.

For example, the wiring structures 300, the insulation interlayers 200 and the separation layer 100 may be further removed from a peripheral portion of the carrier G, thereby forming a package recess PR exposing the peripheral portion of the carrier G. Thus, the first preliminary modified interposer 501a may be downsized to the mounting area MA and the wiring structures 300, the insulation interlayers 200 and the separation layer 100 may be just stacked on the carrier G in the mounting area MA. The first preliminary modified interposer 501a may be arranged on a central portion of the carrier G and the peripheral portion of the carrier G may be exposed around the first preliminary modified interposer 501a.

Then, a mold layer (not shown) may be formed on the carrier G to a sufficient thickness to cover the semiconductor devices 600, so that the package recess PR may be covered with the mold layer and the semiconductor devices 600 and the uppermost insulation layer 260 may be covered with the mold layer. For example, a liquefied mold resin may be coated on the carrier G to a sufficient thickness to cover the semiconductor devices 600 to thereby form a preliminary mold layer, and then the preliminary mold layer may be sufficiently hardened to thereby form the mold layer on the carrier G to a sufficient thickness to cover the semiconductor devices 600.

Then, the mold layer may be planarized until a top surface of the semiconductor devices 600 may be exposed, thereby forming a modified securing mold 700a including the extending mold 750 as well as the package mold 710 and the fence mold 720. The package mold 710 may enclose the mounting area MA of the first preliminary modified interposer 501a; and the semiconductor devices 600 may be enclosed by the package mold 710 and the fence mold 720 may be interposed between the neighboring semiconductor devices 600 in the mounting area MA. The package mold 710 and the fence mold 720 may have upper surfaces coplanar with the top surface of the semiconductor devices 600. The extending package mold 750 may extend downwards from the package mold 710 to the carrier G in such a configuration that the package recess PR may be filled with the extending mold 750.

Thus, a rear surface of the extending mold 750 may have the same level as the rear surface of the separation layer 100; and the separation layer 100 may be covered with the extending mold 750 and the separation layer 100.

Referring to FIG. 11B, the light L may be irradiated onto the carrier G of the first preliminary modified interposer 501a until the separation layer 100 and the extending mold 750 may be partially reformed. That is, the composition of the separation layer 100 and the extending mold 750 may be partially changed in response to the light L.

The light irradiation to the carrier G may be conducted using the same process as described in detail with reference to FIG. 9G and thus any further detailed descriptions on the light irradiation to the carrier G will be omitted. Particularly, the optical characteristics of the light L may be changed in view of the physical properties of the extending mold 750 as well as the separation layer 100.

The light L may penetrate through the carrier G and reach a predetermined depth of the separation layer 100 and the extending mold 750 at the irradiation points, and thus the composition of the separation layer 100 and the extending mold 750 may be partially changed into a soft melting state or a sol state at the irradiation points.

Referring to FIG. 11C, when the separation layer 100 and the extending mold 750 may be sufficiently changed into the soft melting state or the sol state, the carrier G may be forced to be separated from the separation layer 100 and the extending mold 750 by the carrier de-bonding process. A sufficient external force may be applied to the carrier G in such a way that the carrier G may be de-bonded from the separation layer 100.

The soft melting portions may be removed from the separation layer 100 and the extending mold 750 and may remain on the carrier G Therefore, the first recesses 110 and the second recesses 760 each of which may have a depth d and a width w may be arranged on the rear surface of the separation layer 100 and the rear surface of the extending mold 750. A plurality of the first and second recesses 110 and 760 may be arranged on whole (i.e., the entirety of) rear surfaces of the separation layer 100 and the extending mold 750 in such a configuration that the first and second recesses 110 and 760 and a plurality of protrusions P may be alternately repeated on the rear surfaces of the separation layer 100 and the extending mold 750.

While the first recesses 110 and the second recesses 760 may be formed on the rear surfaces of the separation layer 100 and the extending mold 750 under the same arrangement rule by using the single light L, the first recesses 110 and the second recesses 760 may be formed on the rear surfaces of the separation layer 100 and the extending mold 750, respectively, under a different arrangement rule by using multiple lights L. In such a case, the first recesses 110 and the second recesses 760 may be individually formed by a respective light irradiation.

The carrier de-bonding process for separating the carrier G from the separation layer 100 and the extending mold 750 may be substantially the same as the de-bonding process that may be described in detail with reference to FIG. 9H. Thus, any further detailed descriptions on the carrier de-bonding process will be omitted.

Thereafter, a plurality of the contact terminals 800 may be formed on the rear surface of the separation layer 100 in the same process as described in detail with reference to FIG. 9I, to thereby form the first modified semiconductor package 1001 in which a plurality of the semiconductor devices 600 may be mounted on the first modified interposer 501. The first modified semiconductor package 1001 may be provided as a fan-out package in which the side of the first modified interposer 501 may be supported by the extending mold 750 and the combining force between the first modified semiconductor package 1001 and the main board 1100 of the electronic apparatus 2000 may be improved by the first and second recesses 110 and 760.

Figure 12A:
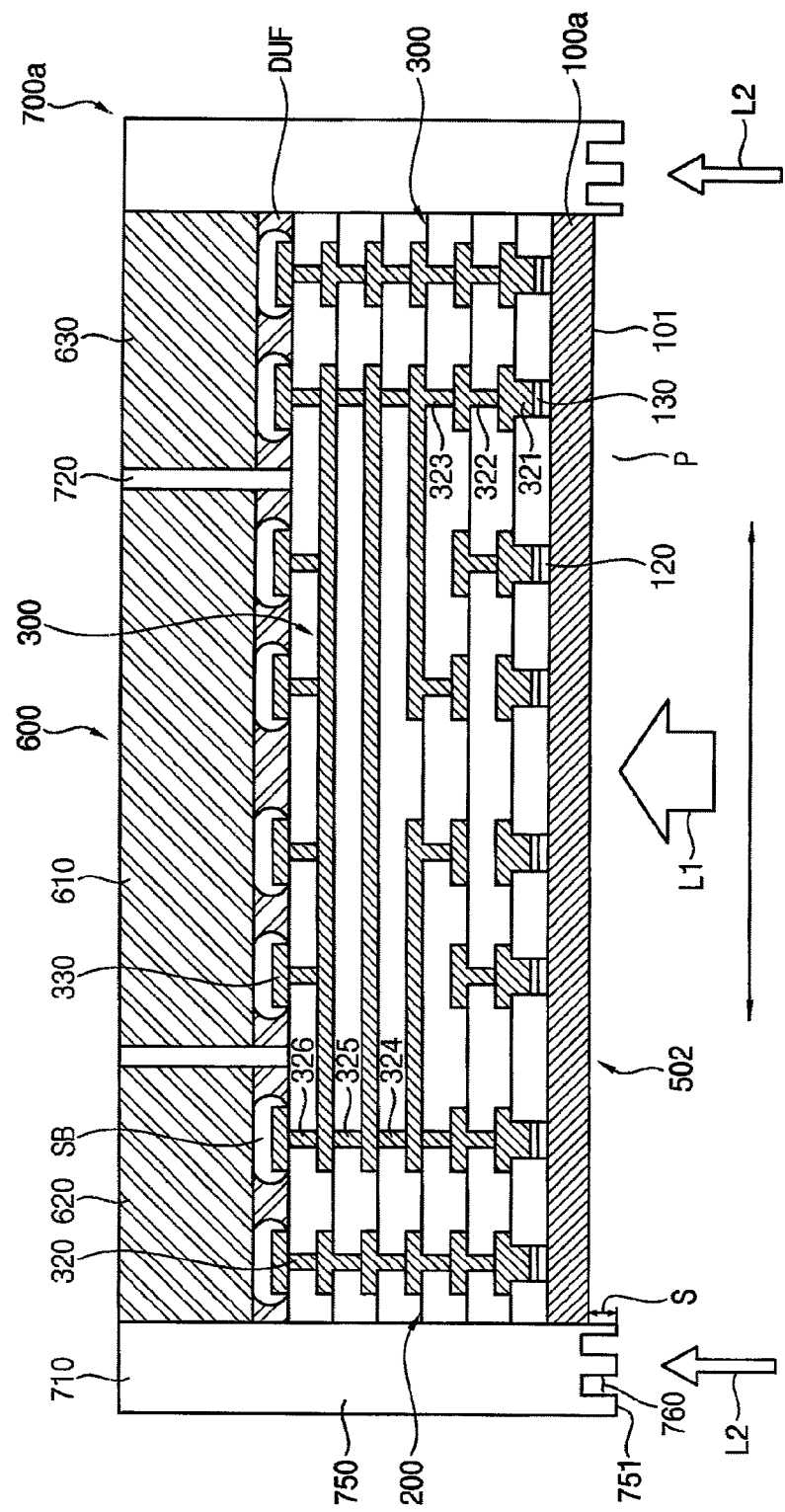
FIGS. 12A to 12B are cross-sectional views illustrating processing steps for a method of manufacturing a second modified semiconductor package shown in FIG. 4.
Figure 12B:
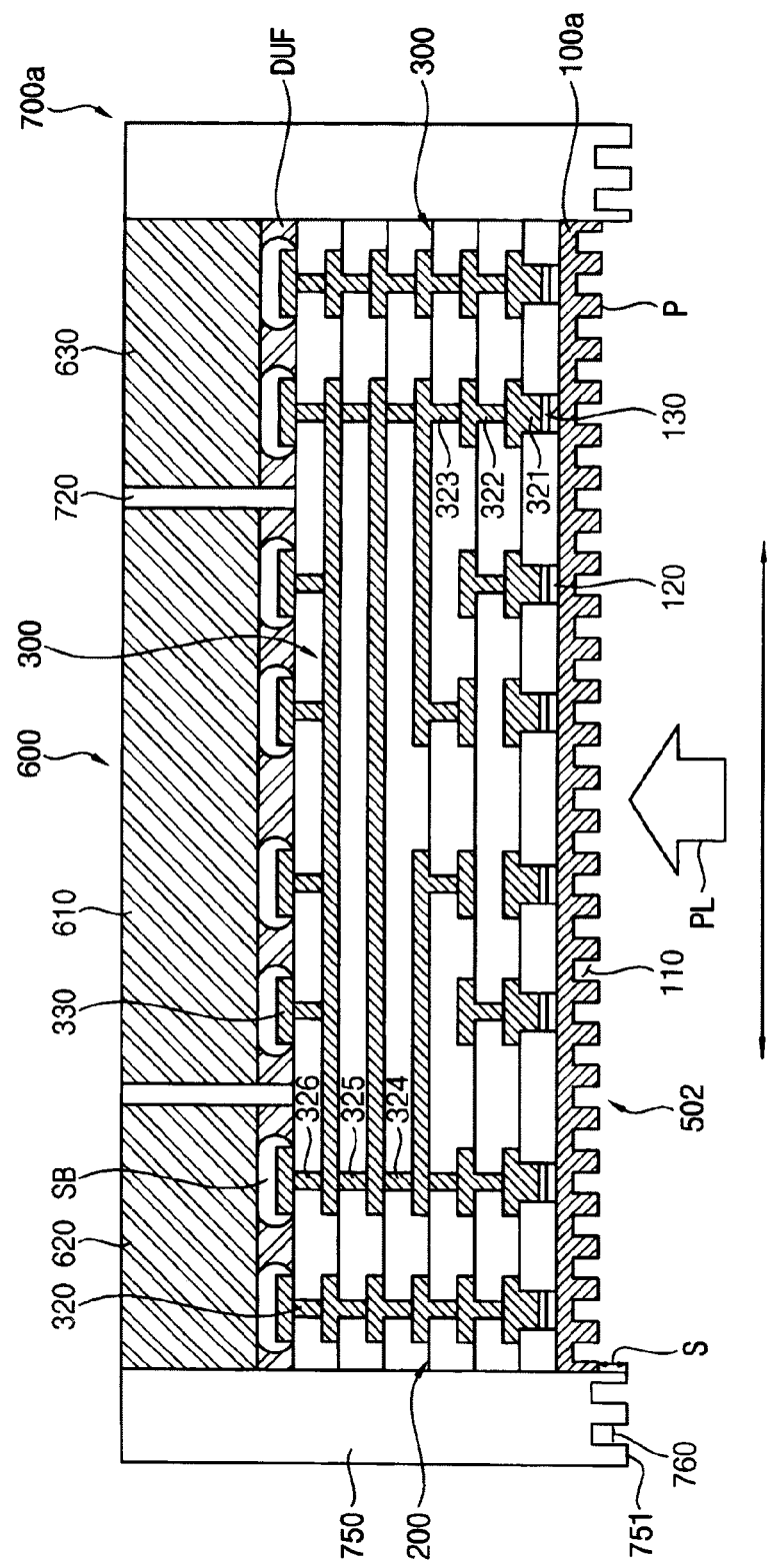

FIGS. 12A to 12B are cross-sectional views illustrating processing steps for a method of manufacturing a second modified semiconductor package shown in FIG. 4. In FIGS. 12A to 12B, a dual light irradiation may be applied to the first preliminary modified interposer 501a in such a way that a plurality of the first recesses 110 and a plurality of the second recesses 760 may be vertically spaced apart.

Referring to FIG. 12A, a first light irradiation may be applied to the first preliminary modified interposer 501a to thereby form a plurality of the second recesses 760 on the rear surface of the extending mold 750 and the reduced separation layer 100a under the first preliminary modified interposer 501a. Then, the carrier G may be separated from the reduced separation layer 100a and the extending mold 750 by the carrier de-bonding process, to thereby form a second modified interposer 502 having a rear step S between the extending molding 750 and the reduced insulation layer 100a.

For example, a first light L1 may be irradiated onto the separation layer 100 and a second light L2 having an intensity lower than that of the first light L1 may be irradiated onto the extending mold 750. Particularly, the first light L1 may be continuously irradiated onto the separation layer 100, so that most of the separation layer 100 may be changed into the soft melting state. In contrast, the second light L2 may be irradiated onto the extending mold 750 sporadically, so that the extending mold 750 may be changed into the soft melting state at the irradiation points.

In the present example embodiment, the first light L1 may include an excimer laser that may be irradiated as a plane beam and the second light L2 may include a DPSS laser that may be irradiated as a Gauss beam. The first light L1 may move regularly under the carrier G and the plane beam having a predetermined size may be irradiated onto the separation layer 100 through the carrier G.

Particularly, while the extending mold 750 may be partially changed into the soft melting state or the sol state, the separation layer 100 may be wholly changed into the soft melting state or the sol state. When the separation layer 100 and the extending mold 750 may be sufficiently changed into the soft melting state or the sol state, the carrier G may be forced to be separated from the extending mold 750 and the separation layer 100 by the carrier de-bonding process. A sufficient external force may be applied to the carrier G in such a way that the carrier G may be de-bonded from the separation layer 100 and the extending mold 750. Thus, a plurality of the second recesses 760 may be formed on the rear surface of the extending mold 750 in the carrier de-bonding process and a lower portion of the separation layer 100 may be removed in the same carrier de-bonding process. Therefore, the separation layer 100 may be formed into the reduced separation layer 100a in which the thickness may be reduced as much as the removed lower portion of the separation layer 100.

Accordingly, the first preliminary modified interposer 501a may be formed into the second modified interposer 502 having the reduced separation layer 100a and a plurality of the second recesses 760 with the rear step S.

Referring to FIG. 12B, a second light irradiation may be applied to the reduced separation layer 100a to thereby form a plurality of the first recesses 110. For example, a process light PL may be irradiated onto the reduced separation layer 100a, to thereby form a plurality of first recesses 110 on a rear surface 101 of the reduced separation layer 100a.

The process light PL may move under the reduced separation layer 100a within an area defined by the extending mold 750 and may be irradiated onto the reduced separation layer 100a.

For example, the process light PL may include an excimer laser or a DPSS laser and the irradiation points of the reduced separation layer 100a may be instantaneously heated, so a plurality of the first recess 110 may be formed on each of the irradiation points of the reduced separation layer 100a.

Particularly, since the process light PL may be directly irradiated onto the reduced separation layer 100a, the optical characteristics of the process light PL may be different from those of the first light L1 and the second light L2. In the present example embodiment, the process light P1 may be controlled in such a way that the depth of the first recesses 110 may be smaller than the thickness of the reduced separation layer 100a.

Thereafter, a plurality of the contact terminals 800 may be formed on the rear surface of the reduced separation layer 100a in the same process as described in detail with reference to FIG. 9I, to thereby form the second modified semiconductor package 1002 in which a plurality of the semiconductor devices 600 may be mounted on the second modified interposer 502.

The second modified semiconductor package 1002 may be provided as a fan-out package in which the side of the second modified interposer 502 may be supported by the extending mold 750 and the combining force between the second modified semiconductor package 1002 and the main board 1100 of the electronic apparatus 2000 may be improved by the first and second recesses 110 and 760.

In addition, when the second modified semiconductor package 1002 may be combined to the main board of the electronic apparatus 2000, the extending mold 750 may be inserted into the package under fill resin 1200 due to the rear step S and may function as an anchor for securing the second modified semiconductor package 1002 to the main board

1100, to thereby much more improve the combining force between the second modified semiconductor package 1002 and the main board 1100.

According to the example embodiments of the present disclosure, the interposer may include the fine-pitched wiring lines and an insulation layer may be used as the separation layer without any additional separation members, so that the interposer may have sufficient flatness at a rear surface thereof despite the trim process. Therefore, the contact failures between the semiconductor devices and the contact terminals may be sufficiently minimized or prevented despite the fine-pitched wiring lines, which may sufficiently improve the operation reliability of the electronic apparatuses despite the fine-pitched wiring lines of the interposer.

In addition, the carrier de-bonding process may be conducted by an optical process instead of a mechanical process. The separation layer and/or the extending mold may be partially changed into a soft melting state or a sol state by the light, so that the separation layer and/or the extending mold may be easily separated from the carrier without any plump defects or separation defects in the trim process. Accordingly, the interposer may have a sufficient flatness despite the fine-pitched or the fine-patterned wiring structures, and thus the contact failures between the semiconductor devices and the contact terminals may be sufficiently prevented in the semiconductor package.

Further, since no additional separation member may be required, no additional etching process may be required after the carrier de-bonding process. When the additional separation member may be provided on the carrier, the additional separation member may remain on the rear surface of the interposer and thus the additional etching process for removing the residuals of the separation member may be required. However, according to the present example embodiment of the present disclosure, no additional etching process may be required after the carrier de-bonding process since no additional separation member may be required.

In addition, a plurality of recesses may be provided on the rear surfaces of the separation layer and the extending mold. Thus, when the semiconductor package may be mounted on the main board of the electronic apparatus, the contact area may be enlarged between the separation layer and the package under fill resin and between the extending mold and the package under fill resin, to thereby improve the combining force between the semiconductor package and the main board.

As is traditional in the field, embodiments may be described and illustrated in terms of blocks which carry out a described function or functions. These blocks, which may be referred to herein as units or modules or the like, are physically implemented by analog and/or digital circuits such as logic gates, integrated circuits, microprocessors, microcontrollers, memory circuits, passive electronic components, active electronic components, optical components, hardwired circuits and the like, and may optionally be driven by firmware and/or software. The circuits may, for example, be embodied in one or more semiconductor chips, or on substrate supports such as printed circuit boards and the like. The circuits constituting a block may be implemented by dedicated hardware, or by a processor (e.g., one or more programmed microprocessors and associated circuitry), or by a combination of dedicated hardware to perform some functions of the block and a processor to perform other functions of the block. Each block of the embodiments may be physically separated into two or more interacting and discrete blocks without departing from the scope of the disclosure. Likewise, the blocks of the embodiments may be physically combined into more complex blocks without departing from the scope of the disclosure. An aspect of an embodiment may be achieved through instructions stored within a non-transitory storage medium and executed by a processor.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present disclosure. Accordingly, all such modifications are intended to be included within the scope of the present disclosure as defined in the claims. In the claims, means-plus-function clauses are intended to cover the structures described herein as performing the recited function and not only structural equivalents but also equivalent structures. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A method of manufacturing a semiconductor package, the method comprising:
   forming a preliminary interposer on a carrier such that the preliminary interposer includes:
      a separation layer having a rear surface located on the carrier, and
      a plurality of wiring structures and a plurality of insulation interlayers alternately stacked on a front surface of the separation layer with each other;
   mounting a plurality of semiconductor devices on the preliminary interposer, side by side, such that the semiconductor devices are connected to the wiring structures;
   forming a securing mold to secure the semiconductor devices to the preliminary interposer and to cover the semiconductor devices and the preliminary interposer;
   forming an interposer by reforming the separation layer by light to form a plurality of reformed first recess portions in the rear surface of the separation layer and then separating the carrier and the reformed first recess portions from the separation layer, wherein the rear surface of the separation layer includes a plurality of first recesses at locations corresponding to the reformed first recess portions separated from the separation layer; and
   forming a plurality of contact terminals on the separation layer from the first recesses such that the contact terminals are connected to the wiring structures.

2. The method of claim 1, wherein forming the preliminary interposer on the carrier includes:
   forming the separation layer on the carrier;
   forming first and second metal patterns stacked on areas of the separation layer in respectively correspondence to the contact terminals such that the first metal pattern includes a under bump metal (UBM) making contact with the contact terminal and the second metal pattern includes seed patterns for plating the plurality of wiring structures; and
   forming the plurality of wiring structures making contact with the second metal pattern and separated from each other by the plurality of insulation interlayers.

3. The method of claim 1, further comprising before mounting the semiconductor devices onto the preliminary interposer:
   separating the preliminary interposer into a plurality of trim panels having a size smaller than that of the preliminary interposer; and
   sequentially etching the wiring structures, the insulation interlayers, and the separation layer from an edge portion of the carrier that is exposed, wherein
   the plurality of semiconductor devices is mounted on the trim panels.

4. The method of claim 3, wherein separating the preliminary interposer into the plurality of trim panels is conducted by a laser beam.

5. The method of claim 1, wherein forming the interposer includes:
   irradiating the light onto the separation layer through the carrier to reform the separation layer at every irradiation point; and
   applying an exterior force to the carrier to separate the carrier from the separation layer such that the plurality of first recesses is formed on the separation layer at every irradiation point.

6. The method of claim 5, wherein the separation layer includes polyimide and the light includes a diode pumped solid state (DPSS) laser that is irradiated onto the separation layer as a Gauss beam.

7. The method of claim 1, wherein forming the securing mold includes:
   removing the wiring structures, the insulation interlayers, and the separation layer from a peripheral portion of the preliminary interposer to thereby form a package recess exposing the peripheral portion of the carrier;
   forming a mold layer on the carrier to a sufficient thickness to fill up the package recess and cover the semiconductor devices; and
   planarizing the mold layer until top surfaces of the semiconductor devices are exposed and such that the securing mold extends to the carrier and a rear surface of the securing mold is coplanar with a rear surface of the separation layer.

8. The method of claim 7, wherein forming the interposer includes:
   irradiating the light onto the separation layer and the securing mold through the carrier to reform the separation layer and the securing mold at every irradiation point; and
   applying an exterior force to the carrier to separate the carrier from the separation layer and the securing mold, such that the plurality of first recesses is formed on a rear surface of the separation layer and a plurality of second recesses is formed on a rear surface of the securing mold at every irradiation point.

9. The method of claim 7, wherein forming the interposer includes:
   continuously irradiating a first light onto the separation layer through the carrier to reform most of the separation layer;
   discontinuously irradiating a second light onto the securing mold through the carrier to reform the securing mold at every irradiation point;
   applying an exterior force to the carrier to separate the carrier from the separation layer and the securing mold to form:
      a plurality of second recesses on a rear surface of the securing mold at every irradiation point, and
      a reduced separation layer having a thickness smaller than that of the separation layer; and
   directly irradiating a process light on the reduced separation layer to form the plurality of first recesses on the reduced separation layer.

10. The method of claim 9, wherein the first light includes an excimer laser irradiated as a plane beam and each of the second light and the process light includes a DPSS laser irradiated as a Gauss beam.

* * * * *